(12) United States Patent
Wang

(10) Patent No.: US 10,504,914 B2
(45) Date of Patent: Dec. 10, 2019

(54) INTEGRATED CIRCUIT STRUCTURE AND MANUFACTURING METHOD THEREOF

(71) Applicant: Powerchip Semiconductor Manufacturing Corporation, Hsinchu (TW)

(72) Inventor: Zih-Song Wang, Nantou County (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 0 days.

(21) Appl. No.: 15/990,696

(22) Filed: May 28, 2018

(65) Prior Publication Data

US 2019/0259773 A1 Aug. 22, 2019

(30) Foreign Application Priority Data

Feb. 21, 2018 (TW) .............................. 107105691 A

(51) Int. Cl.
*H01L 27/11578* (2017.01)
*H01L 27/1157* (2017.01)
*H01L 29/10* (2006.01)
*H01L 21/762* (2006.01)
*H01L 29/06* (2006.01)

(52) U.S. Cl.
CPC ...... *H01L 27/11578* (2013.01); *H01L 21/762* (2013.01); *H01L 27/1157* (2013.01); *H01L 29/0649* (2013.01); *H01L 29/1087* (2013.01)

(58) Field of Classification Search
CPC ............... H01L 21/762; H01L 21/1157; H01L 27/11578; H01L 29/0649; H01L 29/1087
See application file for complete search history.

(56) References Cited

U.S. PATENT DOCUMENTS

| | | | | |
|---|---|---|---|---|
| 9,799,748 B1* | 10/2017 | Xie | ................... | H01L 21/30604 |
| 9,923,055 B1* | 3/2018 | Cheng | ................. | H01L 29/0665 |
| 2013/0075802 A1 | 3/2013 | Chen et al. | | |
| 2013/0307050 A1* | 11/2013 | Ahn | ................. | H01L 27/11524 |
| | | | | 257/319 |
| 2014/0084357 A1* | 3/2014 | Choi | ................... | H01L 27/1157 |
| | | | | 257/324 |
| 2016/0056206 A1 | 2/2016 | Shepard | | |
| 2019/0206885 A1* | 7/2019 | Wang | .................... | H01L 21/765 |

FOREIGN PATENT DOCUMENTS

TW 201403750 1/2014

OTHER PUBLICATIONS

"Office Action of Taiwan Counterpart Application", dated Jul. 19, 2018, p. 1-p. 6.

* cited by examiner

*Primary Examiner* — Savitri Mulpuri
(74) *Attorney, Agent, or Firm* — JCIPRNET

(57) ABSTRACT

An integrated circuit structure including a substrate, a stacked structure, and first contacts is provided. The stacked structure is disposed on the substrate and includes first dielectric layers and conductive layers alternately stacked. The stacked structure has openings passing through the conductive layers. The first contacts are located in the openings. Bottoms of the first contacts are located at different heights. The first contacts and the conductive layers are electrically connected in a one-to-one manner. The first contacts and the conductive layers that are not electrically connected to each other are isolated from each other.

6 Claims, 24 Drawing Sheets

INTEGRATED CIRCUIT STRUCTURE AND MANUFACTURING METHOD THEREOF

CROSS-REFERENCE TO RELATED APPLICATION

This application claims the priority benefit of Taiwan application serial no. 107105691, filed on Feb. 21, 2018. The entirety of the above-mentioned patent application is hereby incorporated by reference herein and made a part of this specification.

BACKGROUND OF THE INVENTION

Field of the Invention

The invention relates to a circuit structure and a manufacturing method thereof, and particularly relates to an integrated circuit structure and a manufacturing method thereof.

Description of Related Art

With the integration of semiconductor devices, the design of an integrated circuit structure becomes more complex, and it requires using a number of photomasks to complete the fabrication of the integrated circuit structure. A 3D-NAND flash memory in a non-volatile memory is taken as an example, the contacts may be allowed to be respectively connected to different layers in a multilayer device by a stepped multilayer pad structure, but the stepped pad structure requires a number of photomasks to make.

The cost of the photomasks is expensive, so how to reduce a number of the photomasks required in the processes is a goal to be achieved in the industry continuously.

SUMMARY OF THE INVENTION

The invention provides an integrated circuit structure, which can effectively reduce a number of photomasks required in the processes.

The invention provides an integrated circuit structure including a substrate, a stacked structure, and first contacts. The stacked structure is disposed on the substrate and includes first dielectric layers and conductive layers alternately stacked. The stacked structure has openings passing through the conductive layers. The first contacts are located in the openings. Bottoms of the first contacts are located at different heights. The first contacts and the conductive layers are electrically connected in a one-to-one manner. The first contacts and the conductive layers which are not electrically connected to each other are isolated from each other.

According to an embodiment of the invention, in the integrated circuit structure, a material of the conductive layers is doped polycrystalline silicon or metal, for example.

According to an embodiment of the invention, in the integrated circuit structure, an arrangement of the first contacts may be a two-dimensional arrangement or a one-dimensional arrangement.

According to an embodiment of the invention, the integrated circuit structure may further includes second dielectric layers. The second dielectric layers are disposed in the openings. The first contacts are located on the second dielectric layers.

According to an embodiment of the invention, the integrated circuit structure may further include third dielectric layers. The third dielectric layers are disposed in the openings and located between the conductive layers and the first contacts. Bottoms of the third dielectric layers are located at different heights.

According to an embodiment of the invention, the integrated circuit structure may further includes isolation layers. Each of the isolation layers is disposed between two adjacent first dielectric layers. A portion of the isolation layers is located between the conductive layers and the third dielectric layers.

According to an embodiment of the invention, in the integrated circuit structure, each of the third dielectric layers may be further extended between the two adjacent first dielectric layers.

According to an embodiment of the invention, in the integrated circuit structure, the first contacts may not be electrically connected to an uppermost layer in the conductive layers.

According to an embodiment of the invention, the integrated circuit structure may further include second contacts. The second contacts are electrically connected to the uppermost layer in the conductive layers and the first contacts respectively.

According to an embodiment of the invention, the integrated circuit structure further includes a fourth dielectric layer. The fourth dielectric layer covers the stacked structure and the first contacts. The second contacts are located in the fourth dielectric layer.

The invention provides a manufacturing method of an integrated circuit structure including following steps. A stacked structure is formed on a substrate. The stacked structure includes first dielectric layers and conductive layers alternately stacked. The stacked structure has openings passing through the conductive layers. First contacts are formed in the openings. Bottoms of the first contacts are located at different heights. The first contacts and the conductive layers are electrically connected in a one-to-one manner. The first contacts and the conductive layers which are not electrically connected to each other are isolated from each other.

According to an embodiment of the invention, in the manufacturing method of the integrated circuit structure, a method of forming the stacked structure may include following steps. First dielectric layers and sacrificial layers are formed alternately on the substrate. Openings are formed in the first dielectric layers and the sacrificial layers. Second dielectric layers filled in the openings are formed. The sacrificial layers are replaced with the conductive layers.

According to an embodiment of the invention, in the manufacturing method of the integrated circuit structure, a method of forming the first contacts may include following steps. Photolithography and etching processes (PEP) are performed on the second dielectric layers to form contact openings with different depths. Third dielectric layers are formed on sidewalls of the contact openings. Bottoms of the third dielectric layers are located at different heights. A portion of the second dielectric layers below the third dielectric layers is removed to expose a portion of the conductive layers. The first contacts are formed in the contact openings.

According to an embodiment of the invention, in the manufacturing method of the integrated circuit structure, the contact openings may be formed by at least one photolithography and etching process in the photolithography and etching processes.

According to an embodiment of the invention, in the manufacturing method of the integrated circuit structure, each of the third dielectric layers may be further extended between the two adjacent first dielectric layers.

According to an embodiment of the invention, the manufacturing method of the integrated circuit structure may further include following step. After the contact openings are formed and before the third dielectric layers are formed, a portion of the conductive layers exposed by the contact openings may be removed such that each of the contact openings is extended between the two adjacent first dielectric layers.

According to an embodiment of the invention, the manufacturing method of the integrated circuit structure may further include following step. Before the second dielectric layers are formed, a portion of the sacrificial layers may be removed such that each of the openings is extended between the two adjacent first dielectric layers.

According to an embodiment of the invention, in the manufacturing method of the integrated circuit structure, an isolation layer may be formed in an extended portion where each of the openings is extended between the two adjacent first dielectric layers.

According to an embodiment of the invention, in the manufacturing method of the integrated circuit structure, the first contacts may not be electrically connected to an uppermost layer in the conductive layers.

According to an embodiment of the invention, the manufacturing method of the integrated circuit structure may further includes following steps. A fourth dielectric layer covering the stacked structure and the first contacts is formed. Second contacts are formed in the fourth dielectric layer. The second contacts are electrically connected to the uppermost layer in the conductive layers and the first contacts respectively.

Based on the above, in the integrated circuit structure and the manufacturing method thereof provided by the invention, the bottoms of the first contacts located in the openings are located at different heights, and the first contacts and the conductive layers are electrically connected in a one-to-one manner. Thereby, the first contacts may be respectively connected to different conductive layers in the stacked structure without forming a stepped pad structure requiring a large number of photomasks to make in the integrated circuit structure. Thus, the number of photomasks required in the processes can be effectively reduced, so as to reduce the manufacturing cost.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 1A to FIG. 1L are cross-sectional views of a manufacturing process of an integrated circuit structure according to an embodiment of the invention.

DESCRIPTION OF THE EMBODIMENTS

Figure 1A:
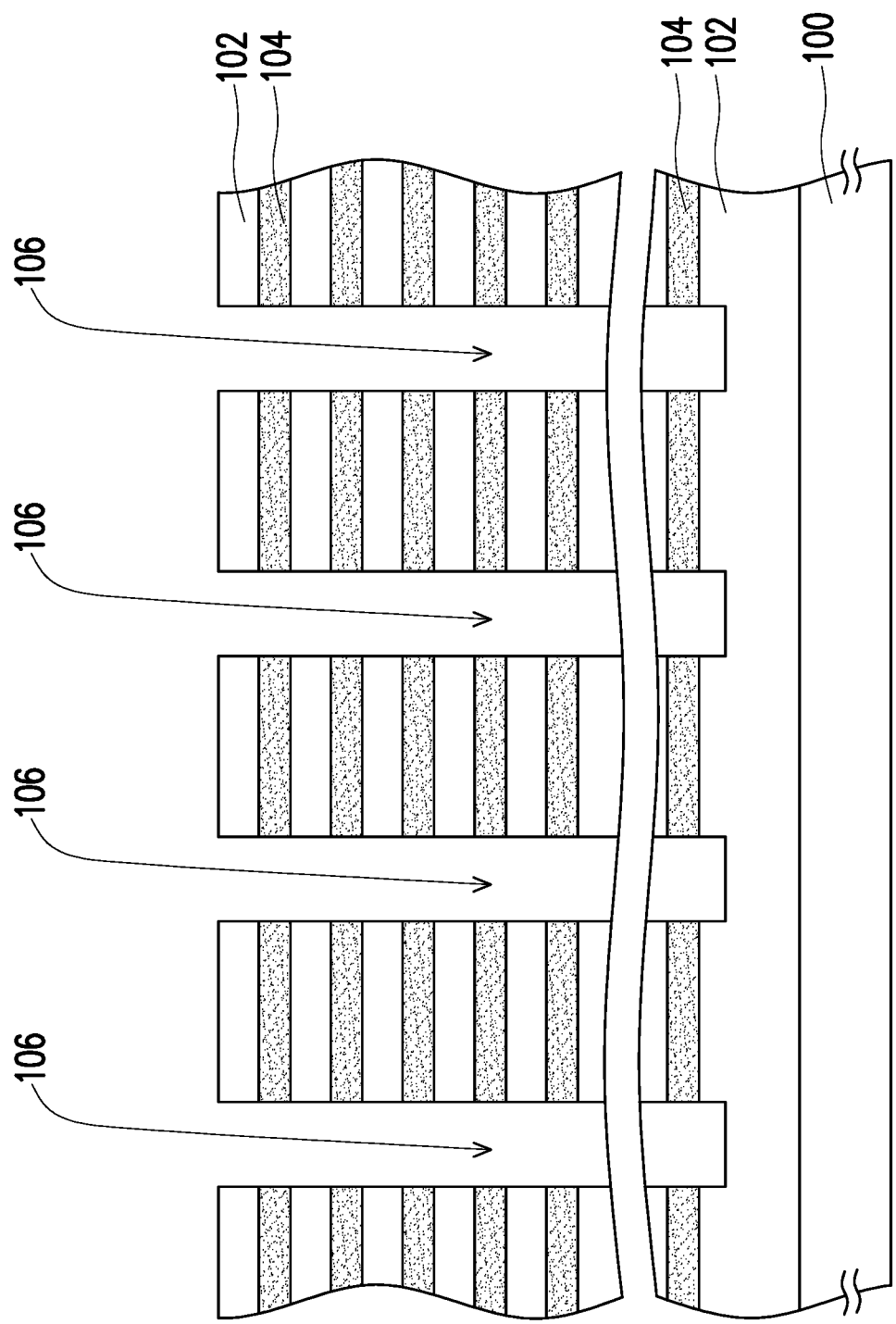

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

FIG. 1A to FIG. 1L are cross-sectional views of a manufacturing process of an integrated circuit structure according to an embodiment of the invention.

Referring to FIG. 1A, dielectric layers 102 and sacrificial layers 104 are alternately formed on a substrate 100. The substrate 100 may be a semiconductor substrate, such as a silicon substrate. A material of the dielectric layers 102 is silicon oxide, for example. A method of forming the dielectric layers 102 is chemical vapor deposition, for example. A material of the sacrificial layers 104 is silicon nitride, for example. A method of forming the sacrificial layers 104 is chemical vapor deposition, for example.

Openings 106 are formed in the dielectric layers 102 and the sacrificial layers 104. A method of forming the openings 106 is to perform a patterning process on the dielectric layers 102 and the sacrificial layers 104 by a photolithography and etching process, for example.

Figure 1B:
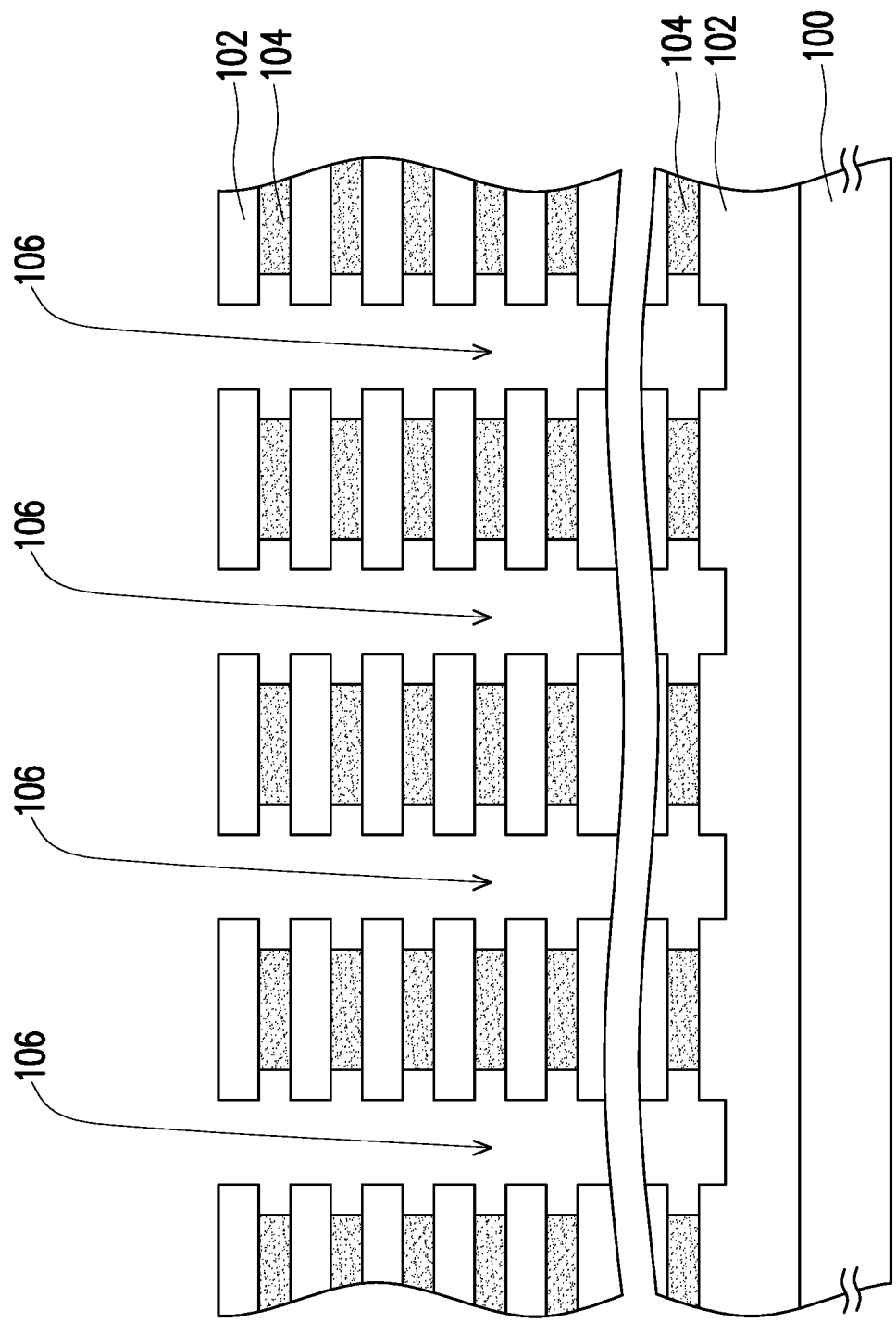

Referring to FIG. 1B, a portion of the sacrificial layers 104 may be removed, such that each of the openings 106 is extended between two adjacent dielectric layers 102. A method of removing the portion of the sacrificial layers 104 is wet etching, for example.

Figure 1C:
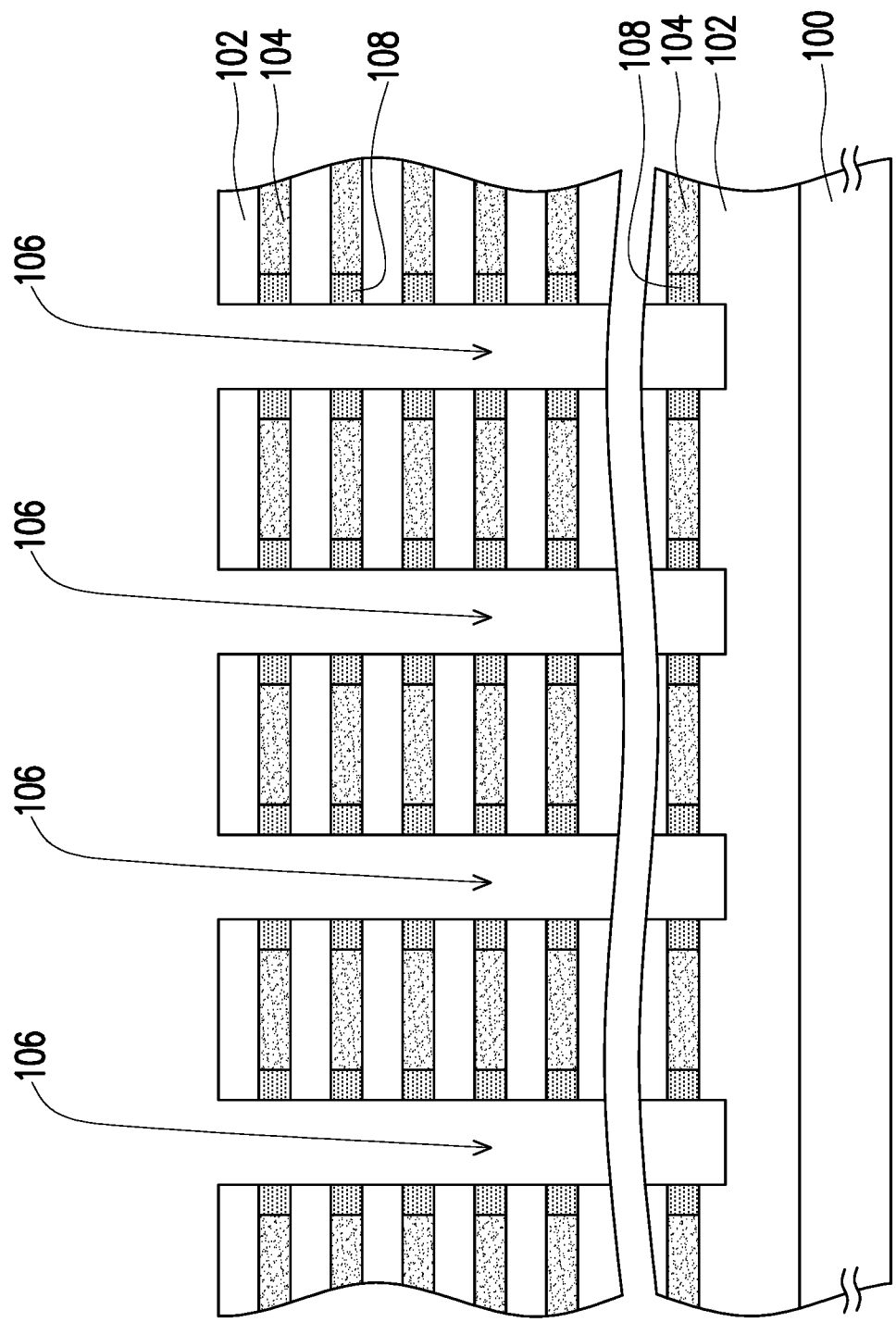

Referring to FIG. 1C, an isolation layer 108 may be formed in an extended portion where each of the openings 106 is extended between the two adjacent dielectric layers 102. A material of the isolation layer 108 is silicon oxide, for example. A method of forming the isolation layer 108 is to form an isolation material layer (not shown) on surfaces of the openings 106, and then to perform an etch-back process on the isolation material layer, for example. A method of forming the isolation material layer is atomic layer deposition, for example.

Figure 1D:
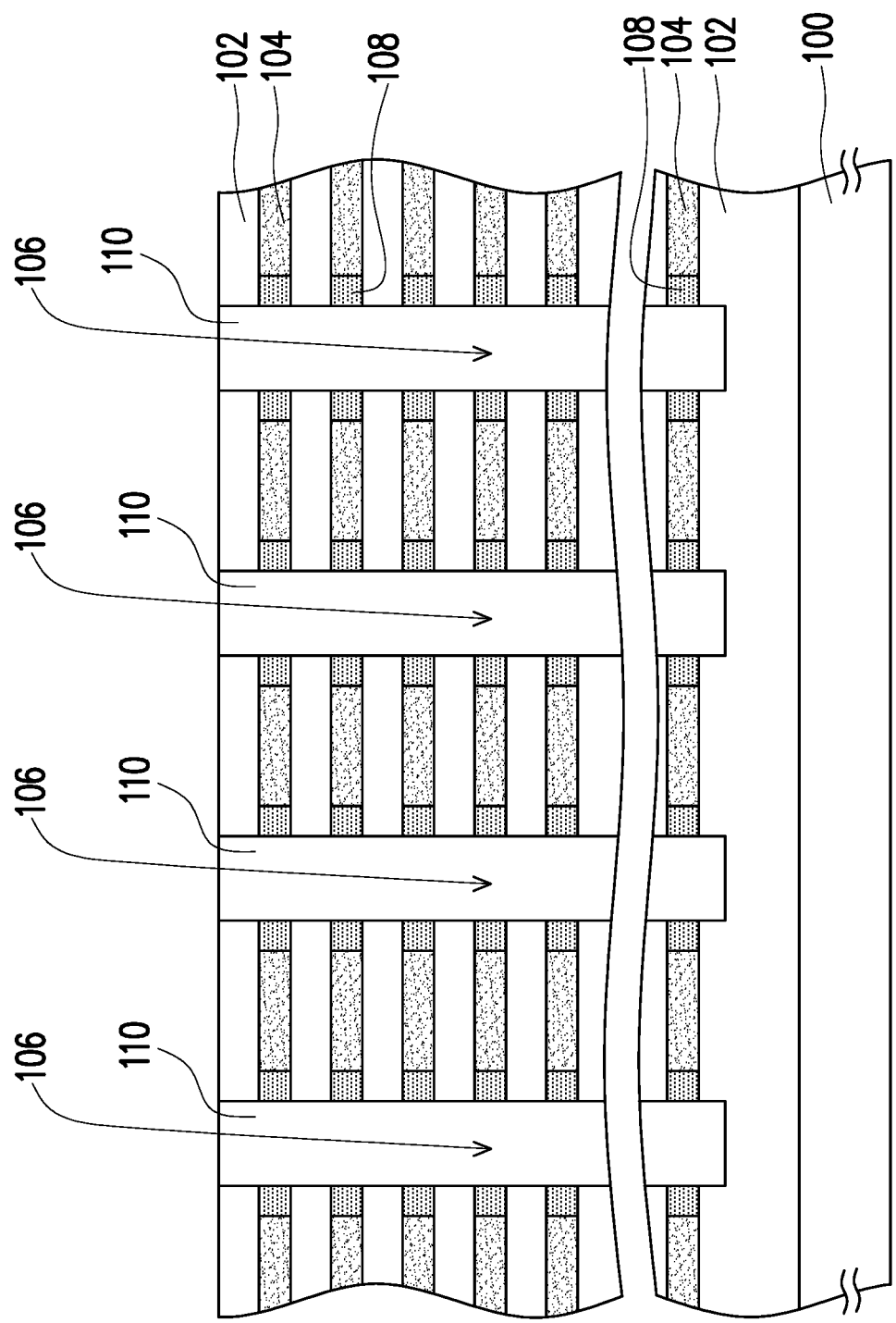

Referring to FIG. 1D, dielectric layers 110 filled in the openings 106 are formed. A material of the dielectric layers 110 is silicon oxide, for example. A method of forming the dielectric layers 110 is to form a dielectric material layer (not shown) filled in the openings 106, and then to perform a planarization process (e.g., an etch-back process) on the dielectric material layer, for example. A method of forming the dielectric material layer is chemical vapor deposition, for example.

Figure 1E:
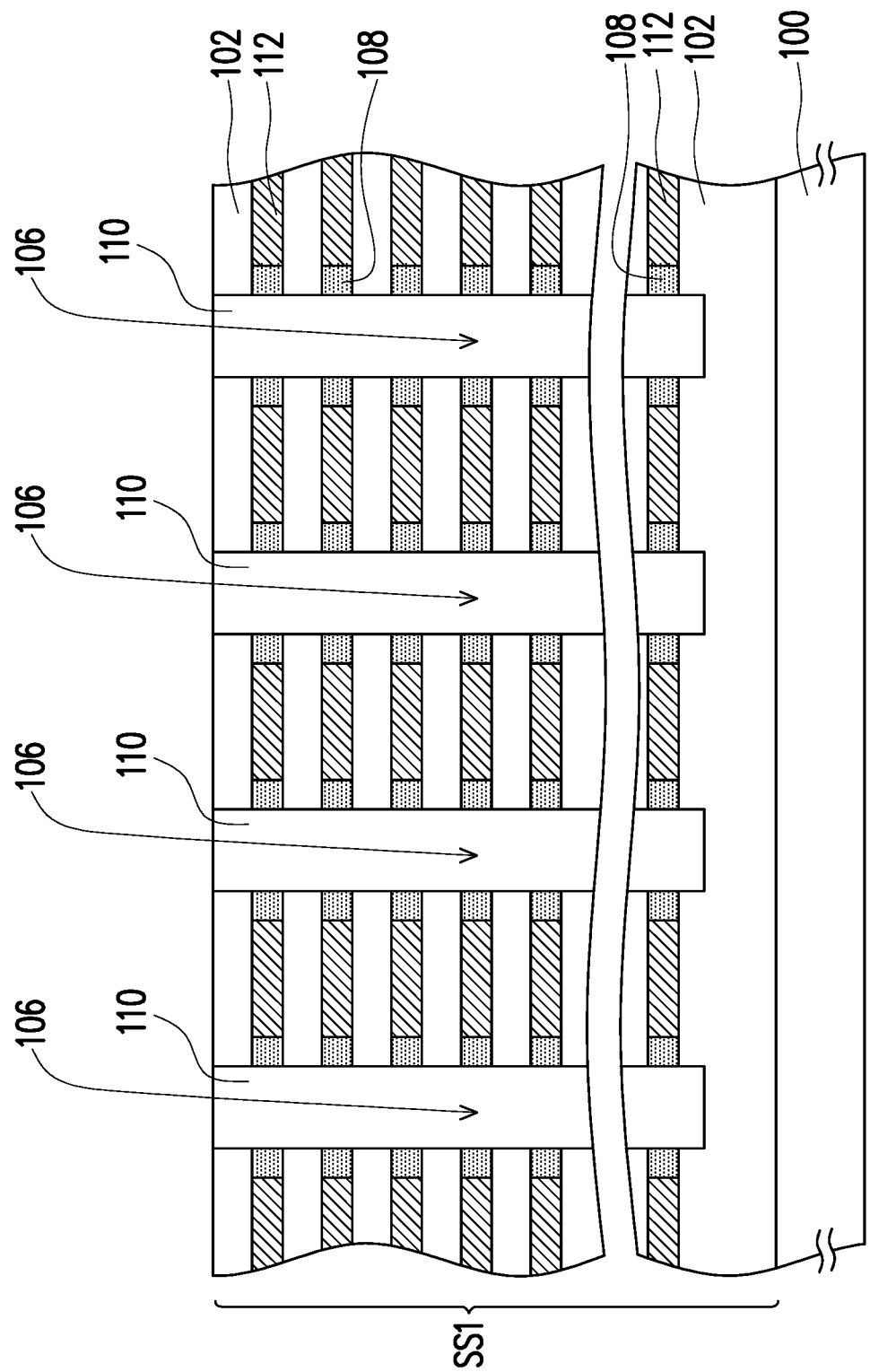

Referring to FIG. 1E, the sacrificial layers 104 are replaced with conductive layers 112. A material of the conductive layers 112 is doped polycrystalline silicon or metal, for example. For instance, when the integrated circuit structure is applied to a 3D-NAND flash memory, the conductive layers 112 may be formed by performing a gate replacement process. Specifically, a wet etching process may be used to remove the sacrificial layers 104 to form openings for replacement (not shown). Then, a conductive material layer (not shown) filled in the openings for replacement is formed, and an etch-back process is performed on the conductive material layer. A method of forming the conductive material layer is atomic layer deposition, for example.

Thereby, a stacked structure SS1 may be formed on the substrate 100. The stacked structure SS1 includes the dielectric layers 102 and the conductive layers 112 alternately stacked. The stacked structure SS1 has the openings 106 passing through the conductive layers 112. In the embodiment, the stacked structure SS1 is formed by the above method, but the invention is not limited thereto.

Figure 1F:
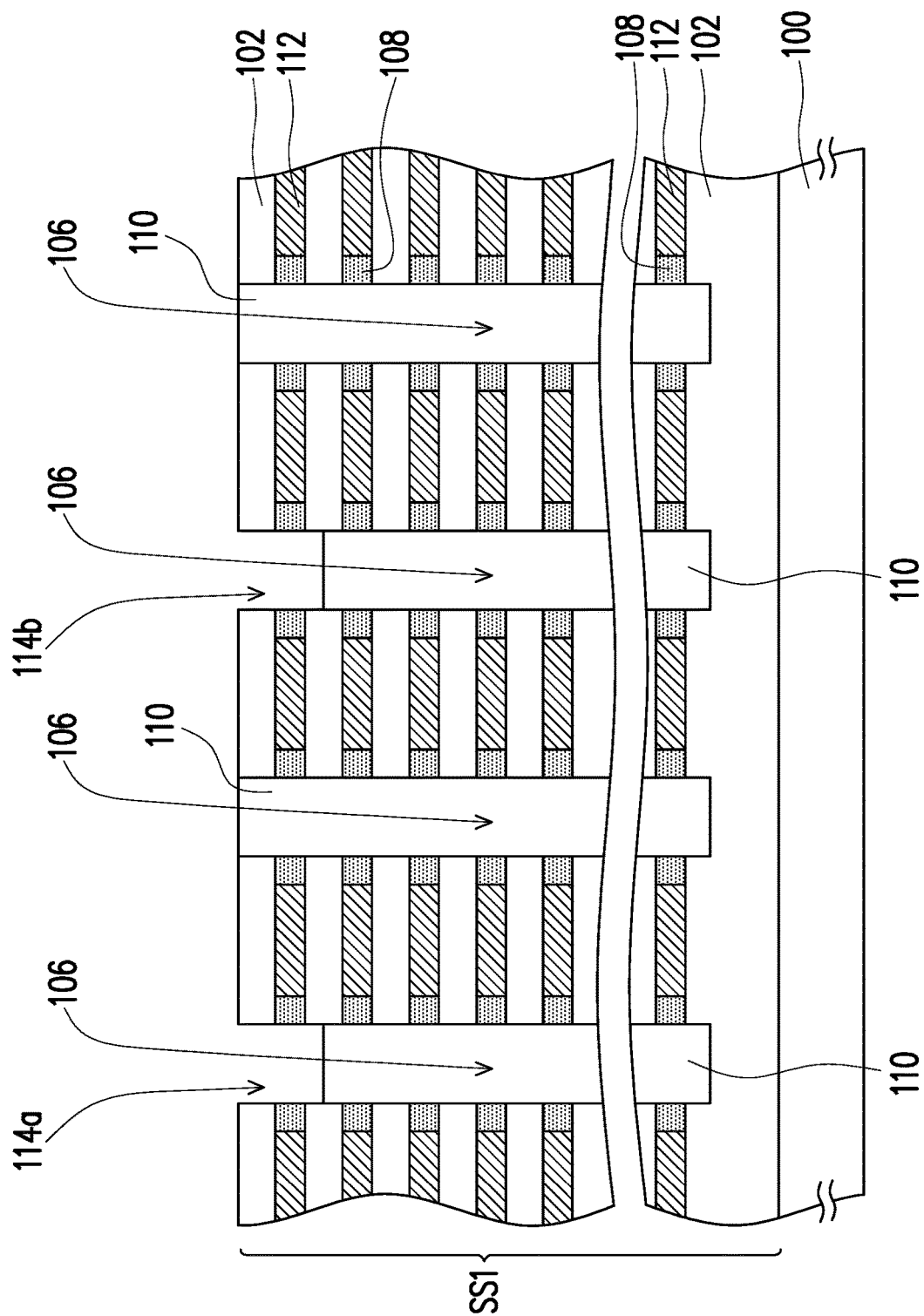
Figure 1G:
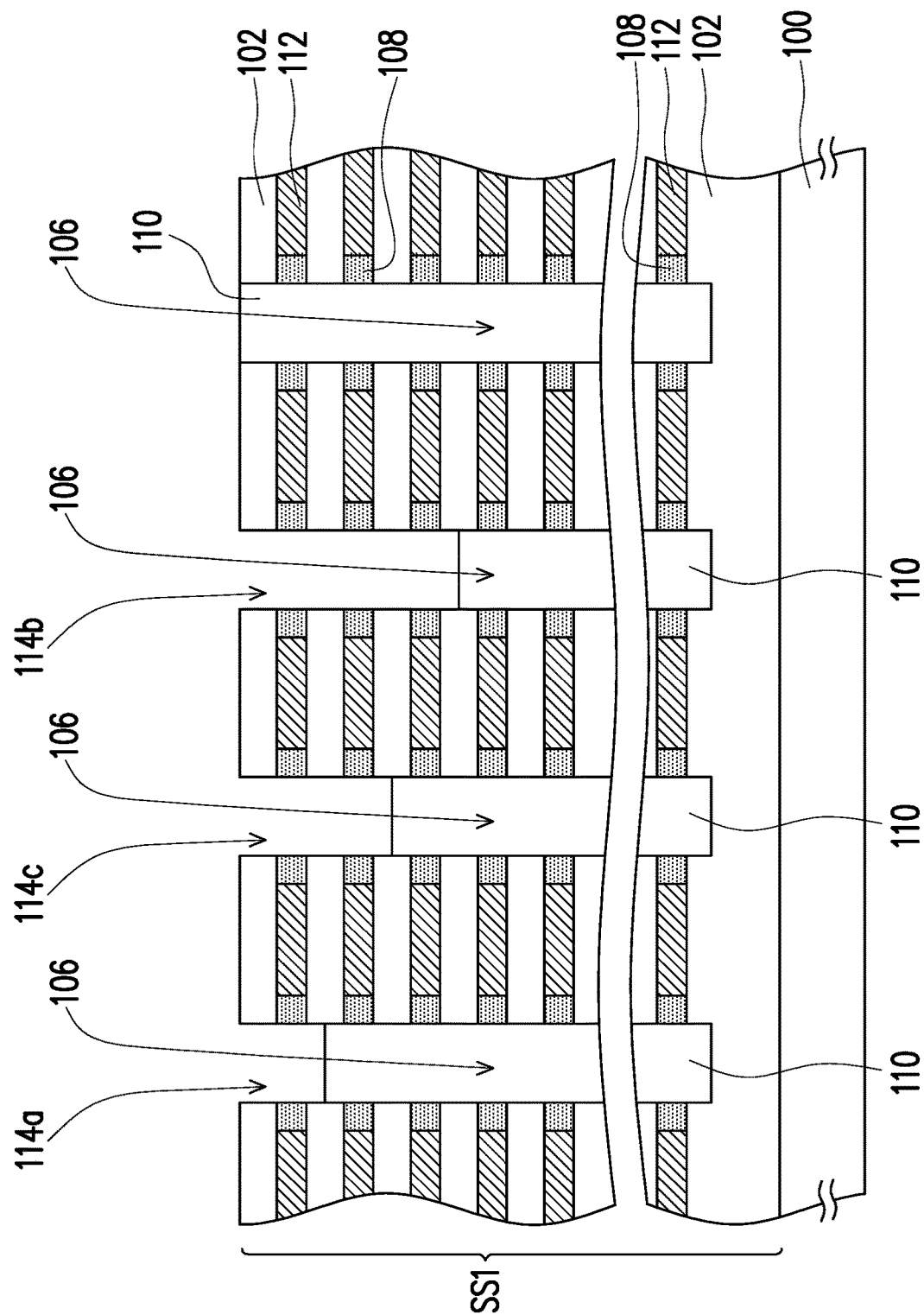
Figure 1H:
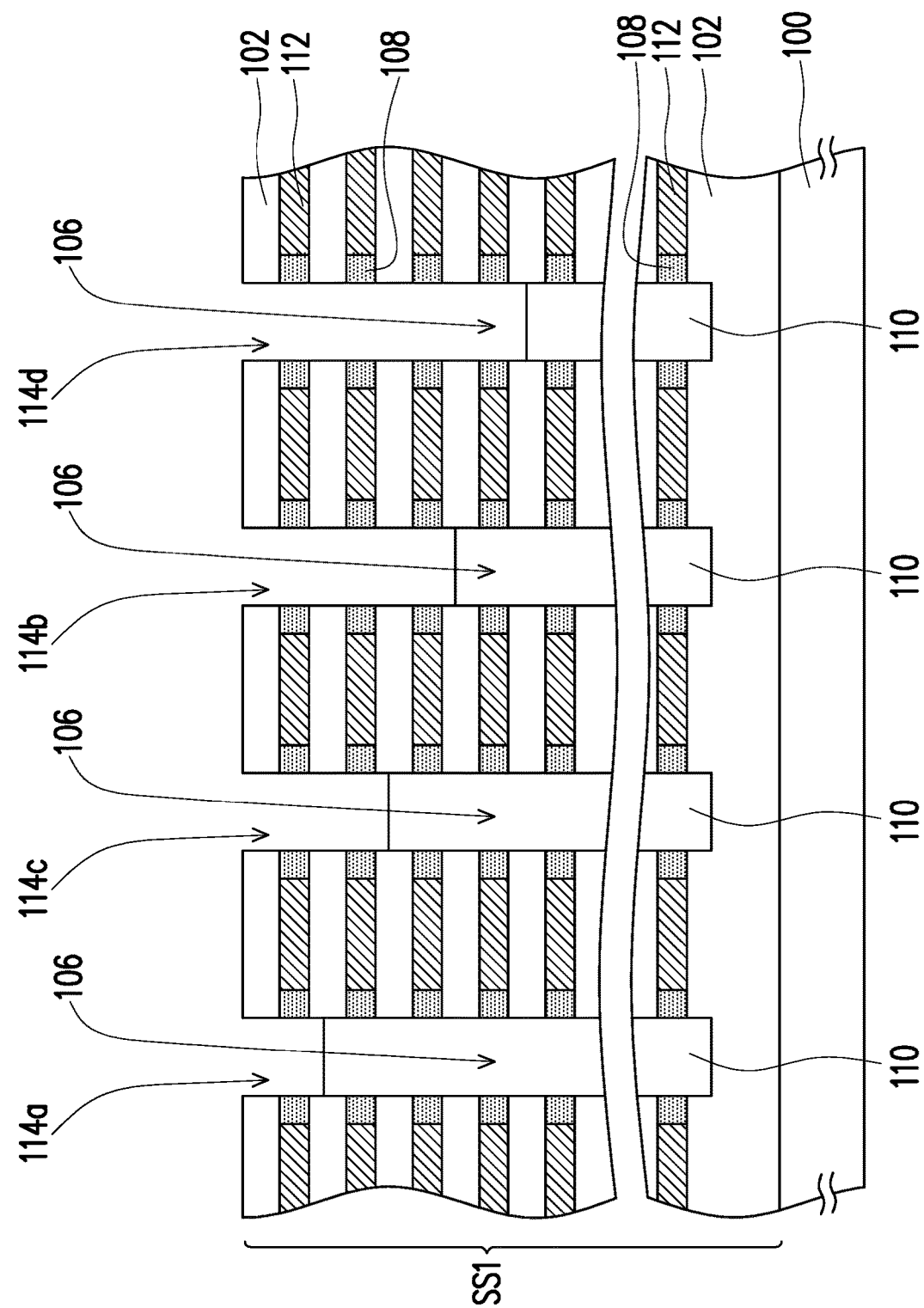
Figure 11:
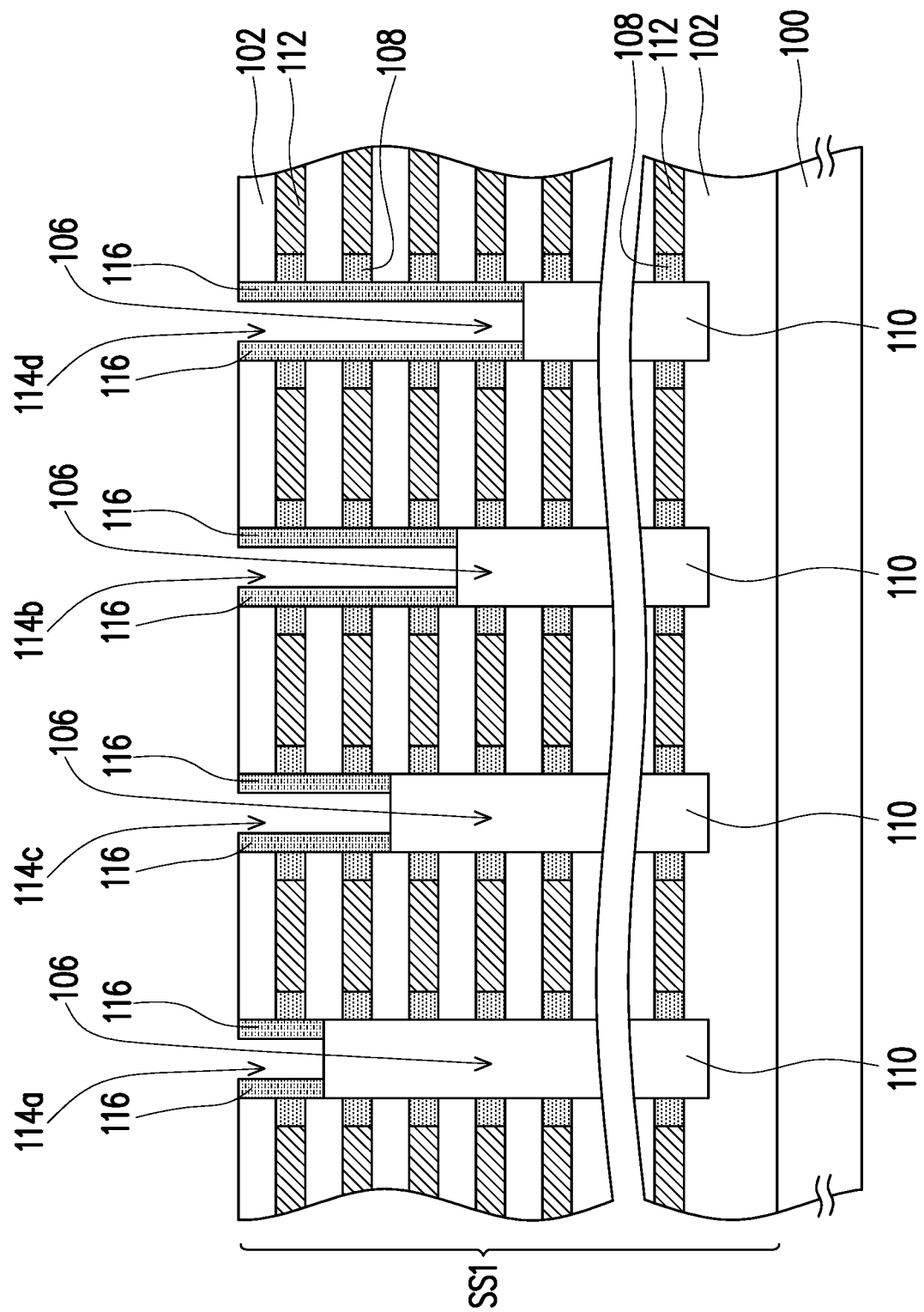

Referring to FIG. 1F to FIG. 1H, photolithography and etching processes are performed on the dielectric layers 110 to form contact openings (e.g., a contact opening 114a to a contact opening 114d) with different depths. The contact opening 114a to the contact opening 114d may be formed by at least one photolithography and etching process in the photolithography and etching processes. Additionally, the contact opening 114a to the contact opening 114d may be a portion of the openings 106.

For instance, referring to FIG. 1F, a first photolithography and etching process is performed on a portion of the dielectric layers 110 to form the contact opening 114a and the contact opening 114b, wherein an etching amount of the first photolithography and etching process is set as an etching amount of a first etching depth. Referring to FIG. 1G, a second photolithography and etching process is performed on a portion of the dielectric layers 110 to form the contact opening 114b and to further increase a depth of the contact opening 114b, wherein an etching amount of the second photolithography and etching process is set as an etching amount of a second etching depth. Therefore, the depth of the contact opening 114b is the first etching depth plus the second etching depth. Referring to FIG. 1H, a third photolithography and etching process is performed on a portion of the dielectric layers 110 to form the contact opening 114d, wherein an etching amount of the third photolithography and etching process is set as an etching amount of a third etching depth.

In the embodiment, the first etching depth, the second etching depth, and the third etching depth may be different. For instance, the first etching depth may be less than the second etching depth, the second etching depth may be less than the third etching depth, and the third etching depth may be more than a total depth of the first etching depth plus the second etching depth. Therefore, the depth of the contact opening 114d may be more than the depth of the contact opening 114b, the depth of the contact opening 114b may be more than the depth of the contact opening 114b, and the depth of the contact opening 114b may be more than the depth of the contact opening 114a.

From FIG. 1F to FIG. 1H, photolithography and etching processes with different etching depths may be used in combination to form the contact openings (e.g., the contact opening 114a to the contact opening 114d) with various depths, so as to effectively reduce the number of photomasks required in the processes. Thereby, the manufacturing cost is reduced.

Referring to FIG. 1I, dielectric layers 116 are formed on sidewalls of the contact opening 114a to the contact opening 114d. Bottoms of the dielectric layers 116 may be located at different heights. A material of the dielectric layers 116 is silicon nitride, for example. A method of forming the dielectric layers 116 is to conformally form a dielectric material layer (not shown) on surfaces of the contact opening 114a to the contact opening 114d, and then to perform an etch-back process on the dielectric material layer. A method of forming the dielectric material layers is chemical vapor deposition, for example.

Figure 1J:
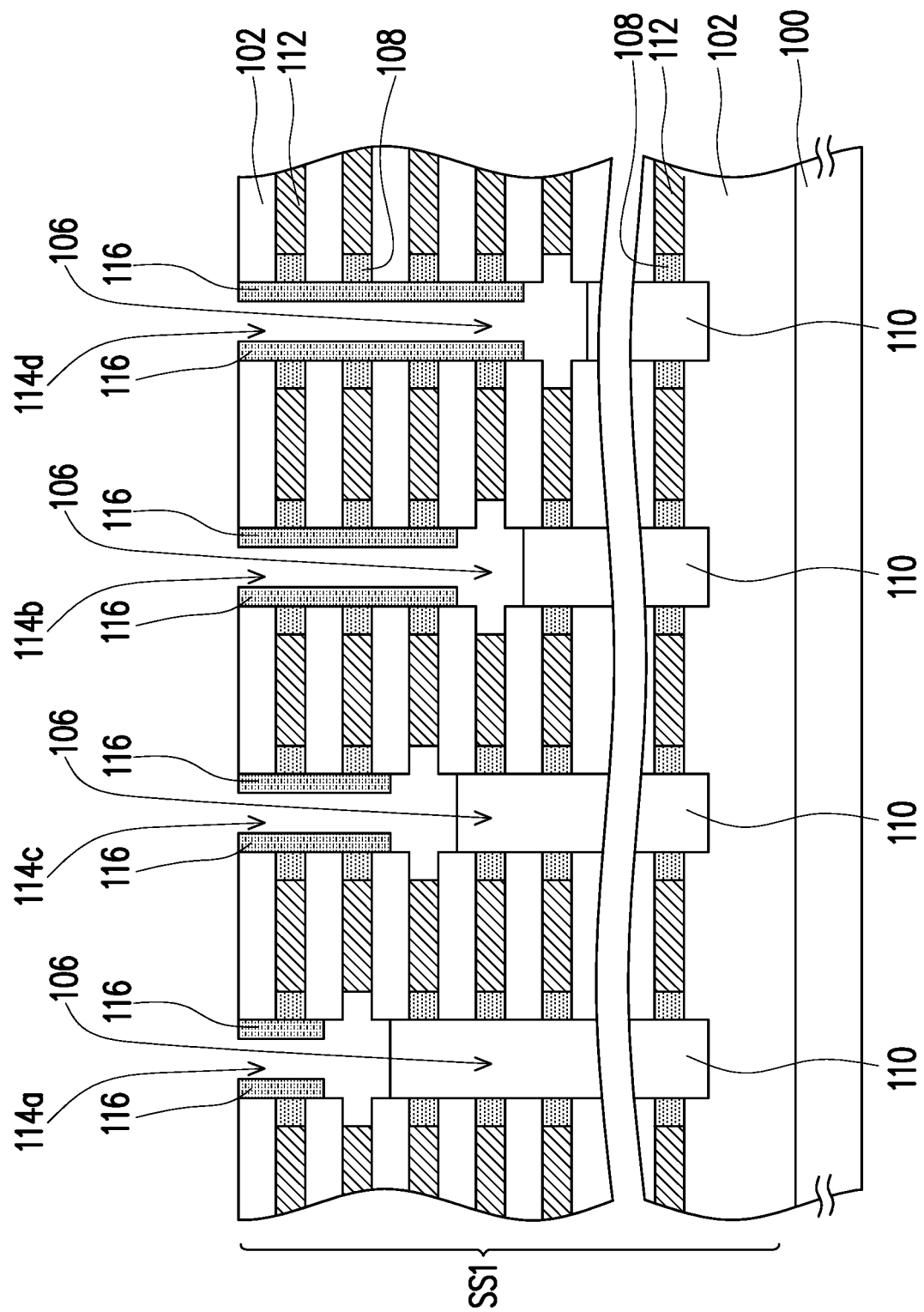

Referring to FIG. 1J, a portion of the dielectric layers 110 and a portion of the isolation layers 108 below the dielectric layers 116 are removed to expose a portion of the conductive layers 112. A method of removing the portion of the dielectric layers 110 and the portion of the isolation layers 108 includes wet etching.

Figure 1K:
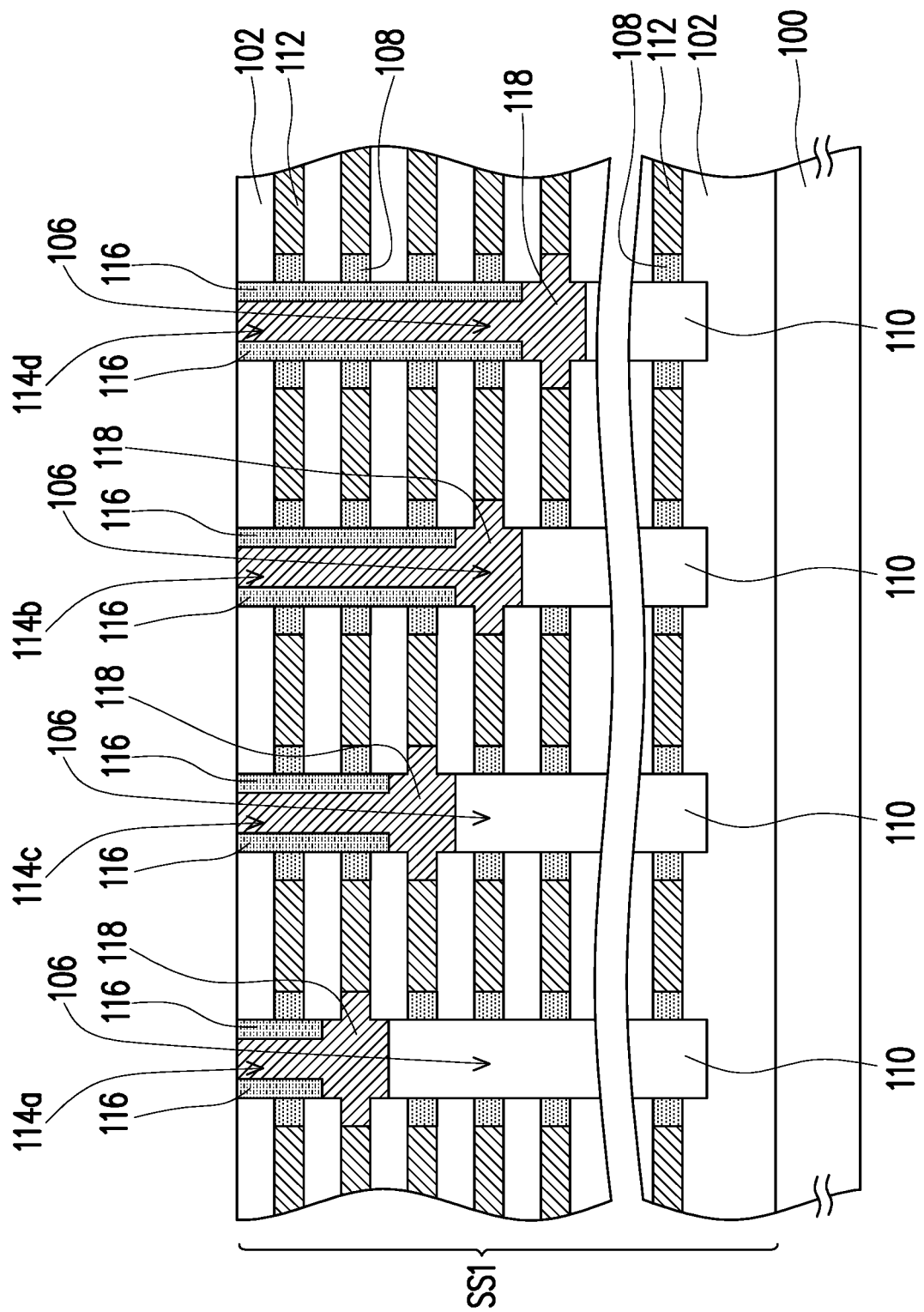

Referring to FIG. 1K, contacts 118 are formed in the contact opening 114a to the contact opening 114d. Bottoms of the contacts 118 are located at different heights. The contacts 118 and the conductive layers 112 are electrically connected in a one-to-one manner. The contacts 118 and the conductive layers 112 which are not electrically connected to each other may be isolated from each other by a dielectric material (e.g., the isolation layers 108, the dielectric layers 110, and the dielectric layers 116). In the embodiment, the contacts 118 may not be electrically connected to an uppermost layer in the conductive layers 112, but the invention is not limited thereto. A material of the contacts 118 is tungsten, for example. A method of forming the contacts 118 is to form a contact material layer (not shown) filled in the contact opening 114a to the contact opening 114d, and then to perform a planarization process (e.g., a chemical mechanical polishing process or an etch-back process) on the contact material layer. A method of forming the contact material layer is physical vapor deposition or chemical vapor deposition, for example. In the embodiment, the contacts 118 are formed by the above method, but the invention is not limited thereto.

Figure 2:
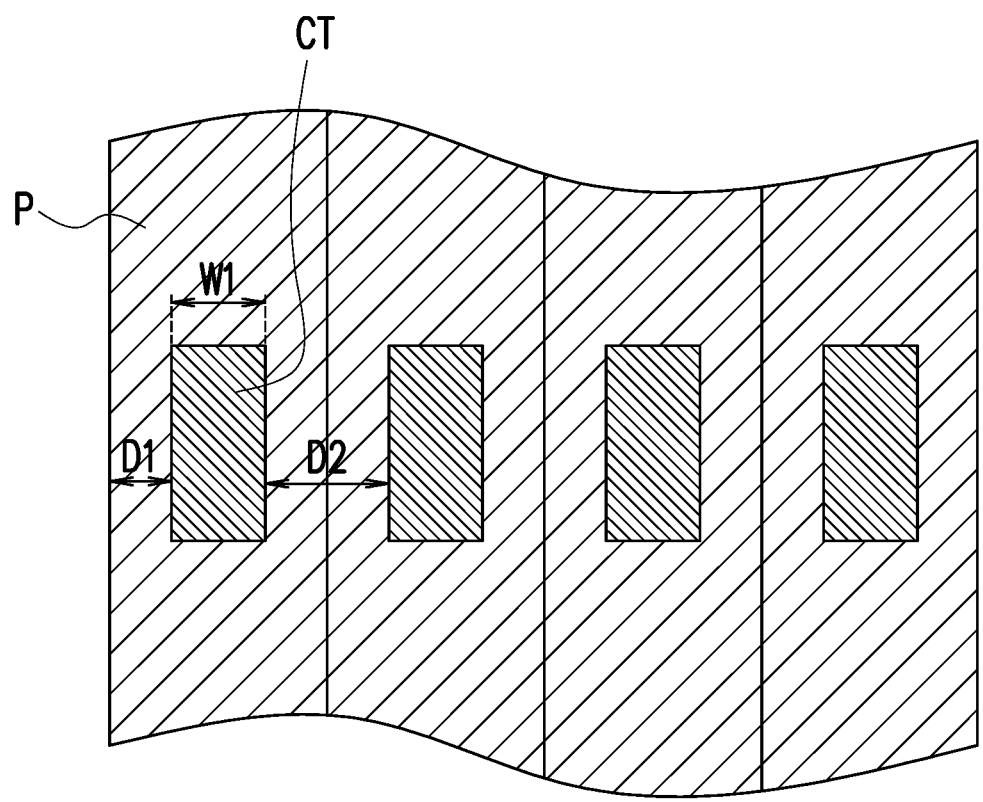
FIG. 2 is a top view of a conventional stepped pad structure and contacts.

FIG. 2 is a top view of a conventional stepped pad structure and contacts.

Referring to FIG. 2, the stepped pad structure includes pads P. Additionally, contacts CT are electrically connected to the corresponding pads P respectively. However, in a conventional layout design of the contacts CT, a width W1 of the contact CT, a distance D1 between the contact CT and a side of the pad P, and a distance D2 between adjacent contacts CT should be considered at the same time to avoid a short circuit between the adjacent contacts CT.

Figure 3A:
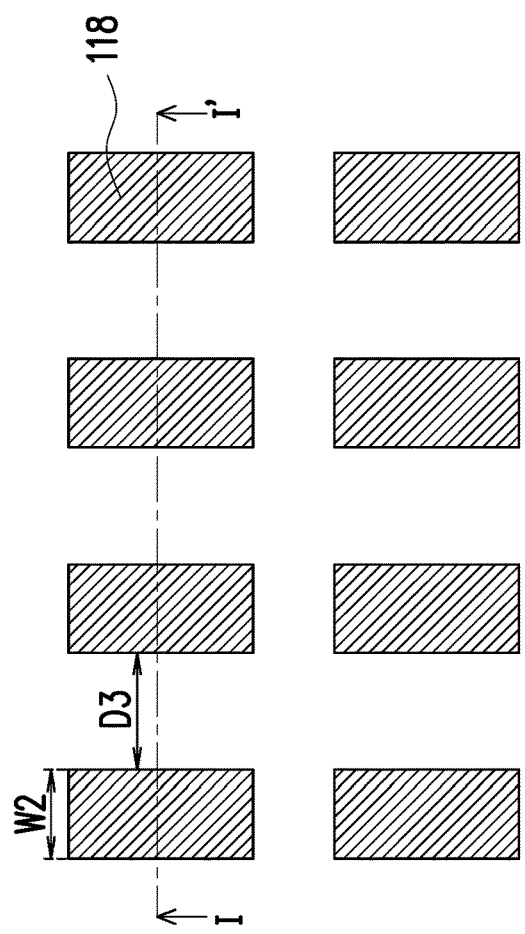
FIG. 3A and FIG. 3B are top views of contacts in FIG. 1K according to an embodiment and another embodiment of the invention respectively.
Figure 3B:
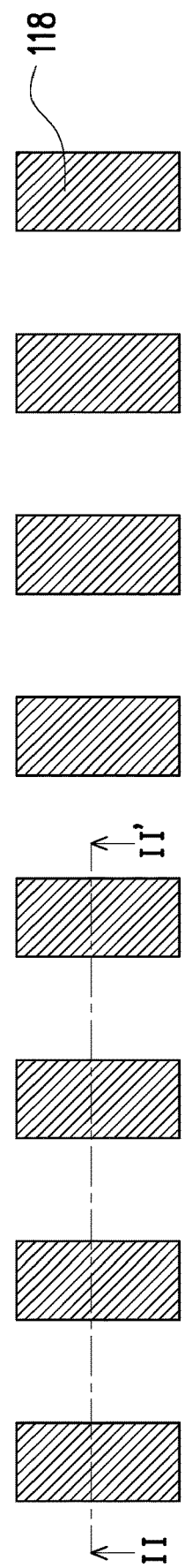

FIG. 3A and FIG. 3B are top views of the contacts in FIG. 1K according to some embodiments of the invention respectively. FIG. 1K may be a cross-sectional view taken along a section line I-I' in FIG. 3A or a section line II-II' in FIG. 3B.

Referring to FIG. 3A and FIG. 3B, an arrangement of the contacts 118 may be a two-dimensional arrangement (FIG. 3A) or a one-dimensional arrangement (FIG. 3B). Additionally, in a case where the arrangement of the contacts 118 is a two-dimensional arrangement, a device area of the integrated circuit structure can be effectively decreased.

In the embodiment, as shown in FIG. 3A, in the layout design of the contacts 118, only a width W2 of the contact 118 and a distance D3 between the adjacent contacts 118 should be considered, and thus the complexity of the layout design can be reduced.

Figure 1L:
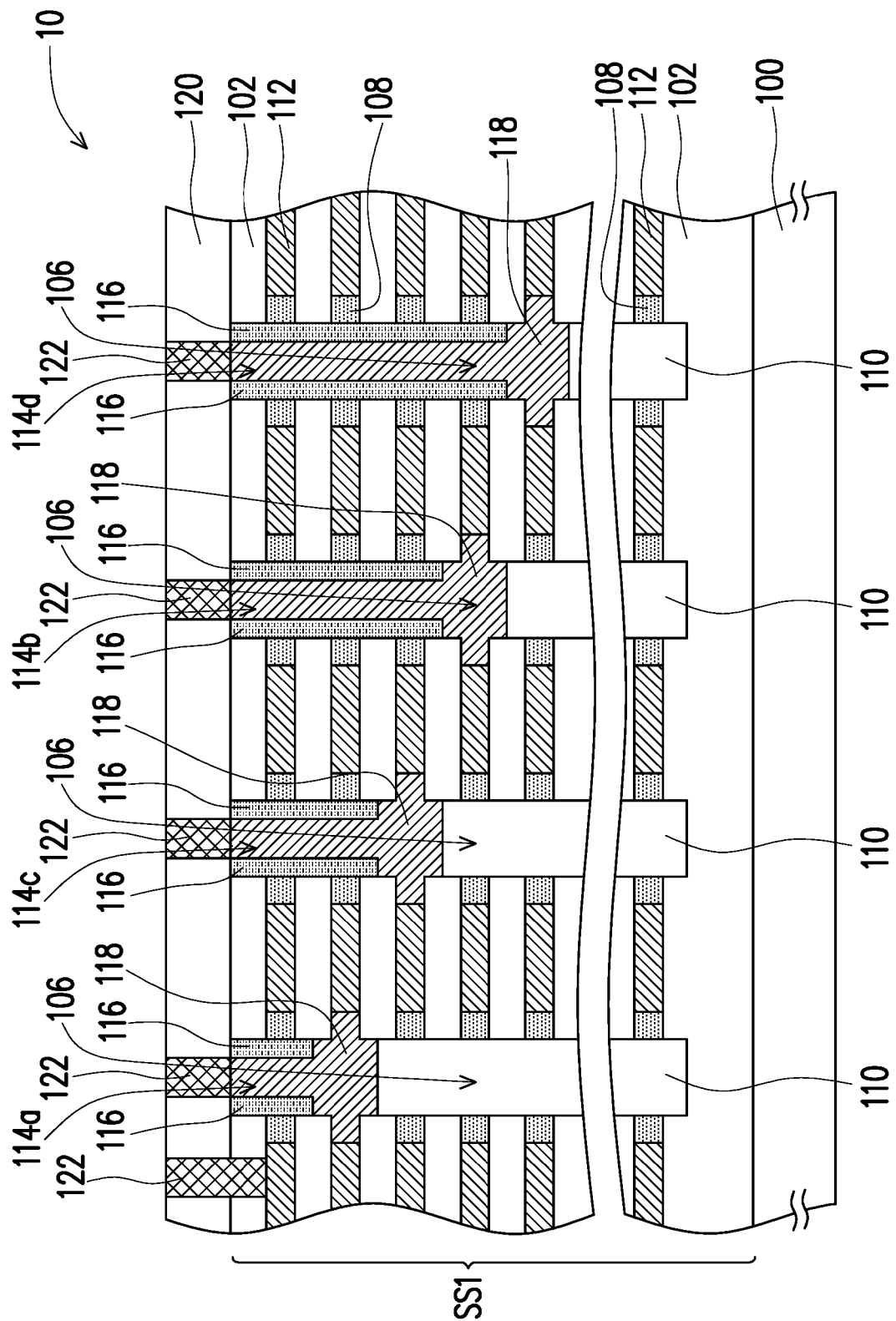

Referring to FIG. 1L, a dielectric layer 120 covering the stacked structure SS1 and the contacts 118 may be formed. A material of the dielectric layer 120 is silicon oxide, for example. A method of forming the dielectric layer 120 is chemical vapor deposition, for example.

Contacts 122 may be formed in the dielectric layer 120. The contacts 122 are electrically connected to the uppermost layer in the conductive layers 112 and the contacts 118 respectively. A material of the contacts 118 is tungsten, for example. A method of forming the contacts 122 is a damascene process, for example.

Based on the above embodiments, in the manufacturing method of an integrated circuit structure 10, the openings 106 pass through the conductive layers 112, the bottoms of the contacts 118 located in the openings 106 are located at different heights, and the contacts 118 and the conductive layers 112 are electrically connected in a one-to-one manner. Thereby, the contacts 118 may be respectively connected to the different conductive layers 112 in the stacked structure SS1 without forming the stepped pad structure requiring a large number of photomasks to make in the integrated circuit structure 10. Thus, the number of photomasks required in the processes can be effectively reduced, so as to reduce the manufacturing cost.

Hereinafter, the integrated circuit structure 10 of the above embodiment will be illustrated with FIG. 1L. The integrated circuit structure 10 may be applied to various semiconductor devices. For instance, the integrated circuit structure 10 may be applied to a 3D-NAND flash memory.

Referring to FIG. 1L, the integrated circuit structure 10 includes the substrate 100, the stacked structure SS1, and the contacts 118, and may further include at least one of the isolation layer 108, the dielectric layers 110, the dielectric layers 116, the dielectric layer 120, and the contacts 122. The stacked structure SS1 is disposed on the substrate 100 and includes the dielectric layers 102 and the conductive layers 112 alternately stacked. The stacked structure SS1 has the openings 106 passing through the conductive layers 112. The contacts 118 are located in the openings 106. The bottoms of the contacts 118 are located at different heights. The contacts 118 and the conductive layers 112 are electrically connected in a one-to-one manner. In the embodiment, the contacts 118 may not be electrically connected to the uppermost layer in the conductive layers 112, but the invention is not limited thereto. The dielectric layers 110 are disposed in the openings 106. The contacts 118 are located on the dielectric layers 110. The dielectric layers 116 are disposed in the openings 106 and located between the conductive layers 112 and the contacts 118. The bottoms of the dielectric layers 116 may be located at different heights. Each of the isolation layers 108 is disposed between the two adjacent dielectric layers 102. A portion of the isolation layer 108 is located between the conductive layers 112 and the dielectric layers 116. The contacts 118 and the conductive layers 112 which are not electrically connected to each other may be isolated from each other by a dielectric material (e.g., the isolation layer 108, the dielectric layers 110, and the dielectric layers 116). The dielectric layer 120 covers the stacked structure SS1 and the contacts 118. The contacts 122 are located in the dielectric layer 120 and electrically connected to the uppermost layer in the conductive layers 112 and the contacts 118 respectively.

Additionally, the materials, forming methods, and functions of each component in the integrated circuit structure 10 have been illustrated in detail in the above embodiments, and are not repeated here.

FIG. 4A to FIG. 4J are cross-sectional views of a manufacturing process of an integrated circuit structure according to another embodiment of the invention.

Figure 4A:
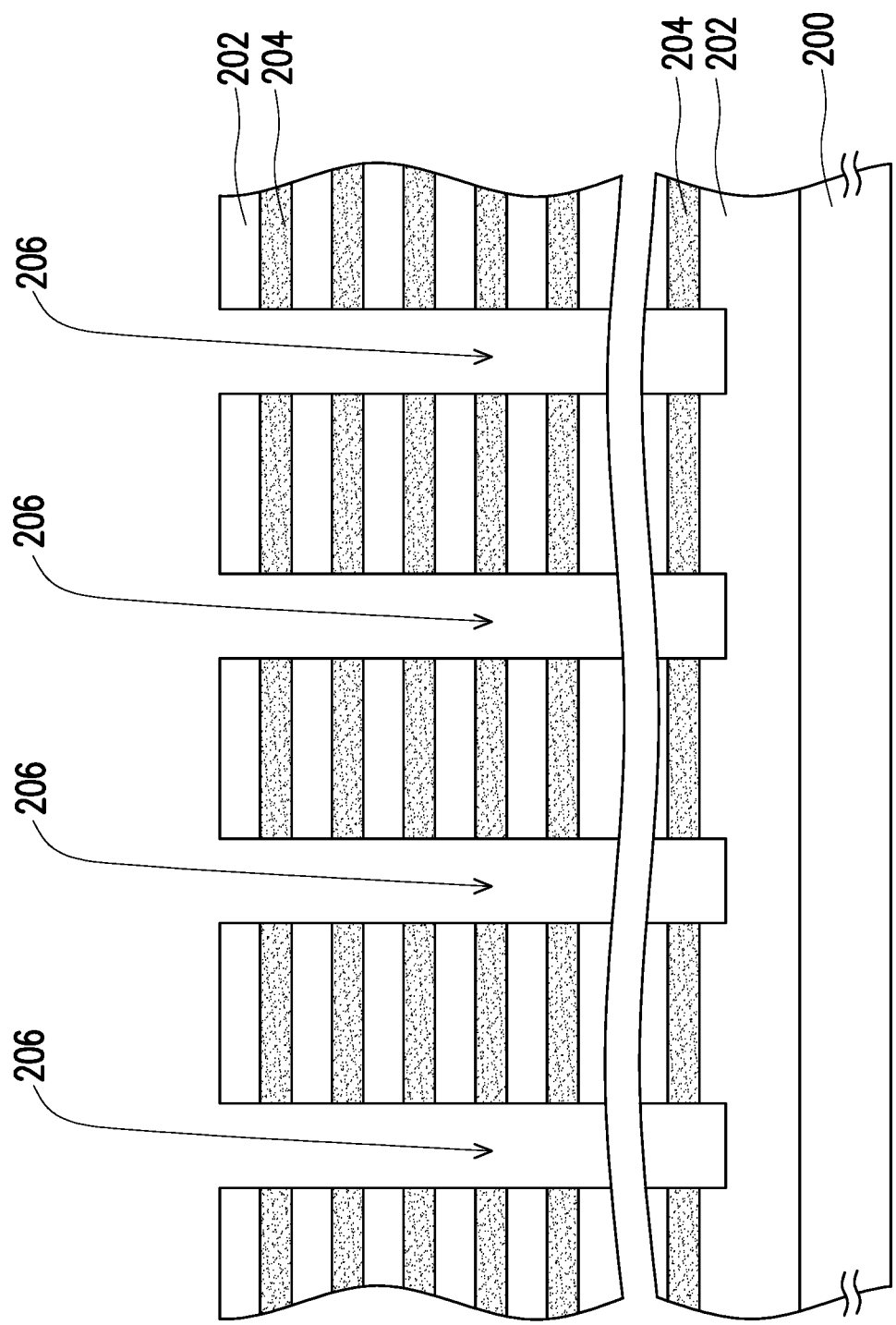
FIG. 4A to FIG. 4J are cross-sectional views of a manufacturing process of an integrated circuit structure according to another embodiment of the invention.

Referring to FIG. 4A, dielectric layers 202 and sacrificial layers 204 are alternately formed on a substrate 200. The substrate 200 may be a semiconductor substrate, such as a silicon substrate. A material of the dielectric layers 202 is silicon oxide, for example. A method of forming the dielectric layers 202 is chemical vapor deposition, for example. A material of the sacrificial layers 204 is silicon nitride, for example. A method of forming the sacrificial layers 204 is chemical vapor deposition, for example.

Openings 206 are formed in the dielectric layers 202 and the sacrificial layers 204. A method of forming the openings 206 is to perform a patterning process on the dielectric layers 202 and the sacrificial layers 204 by a photolithography and etching process, for example.

Figure 4B:
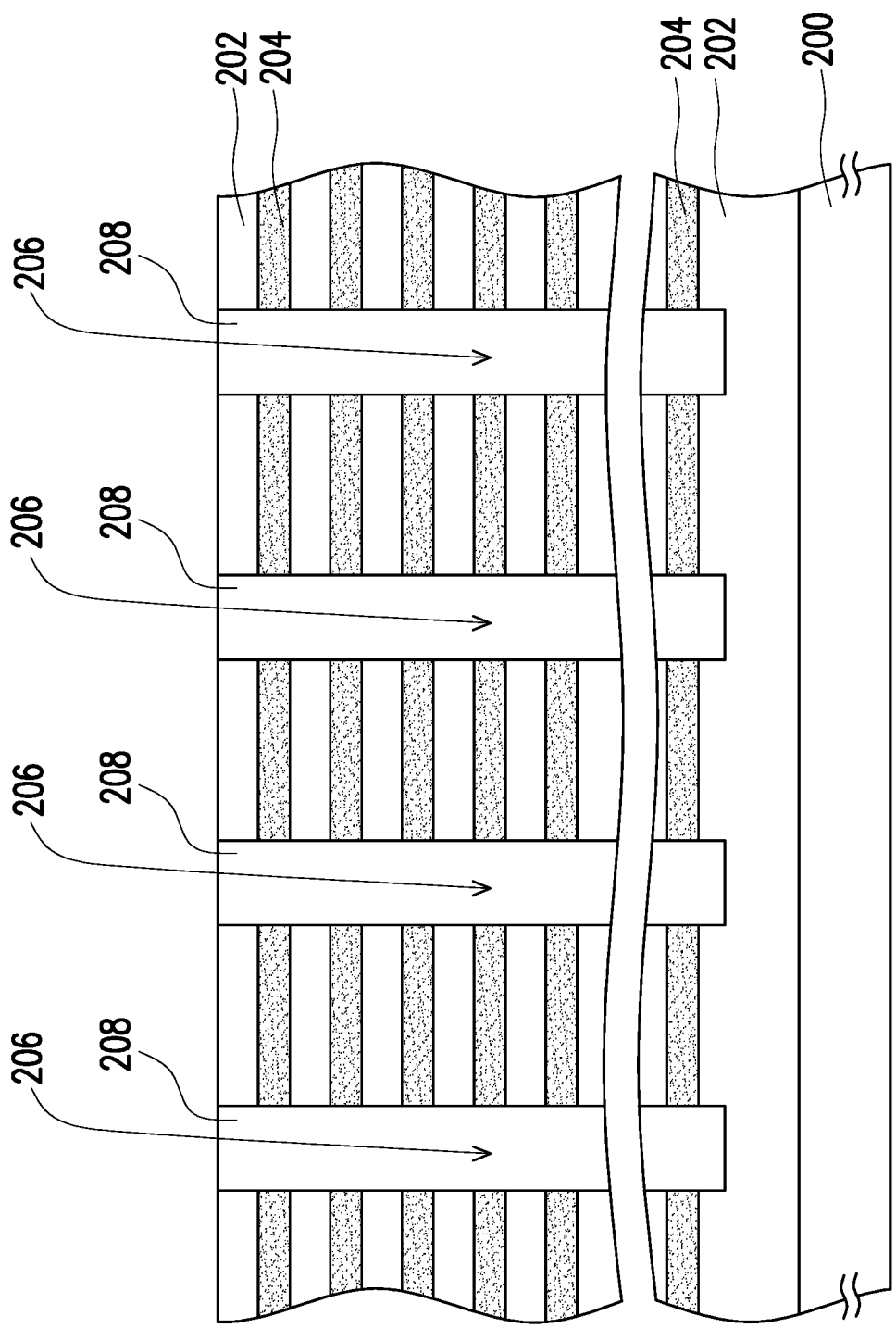

Referring to FIG. 4B, dielectric layers 208 filled in the openings 206 are formed. A material of the dielectric layers 208 is silicon oxide, for example. A method of forming the dielectric layers 208 is to form a dielectric material layer (not shown) filled in the openings 206, and then to perform a planarization process (e.g., an etch-back process) on the dielectric material layer, for example. A method of forming the dielectric material layer is chemical vapor deposition, for example.

Figure 4C:
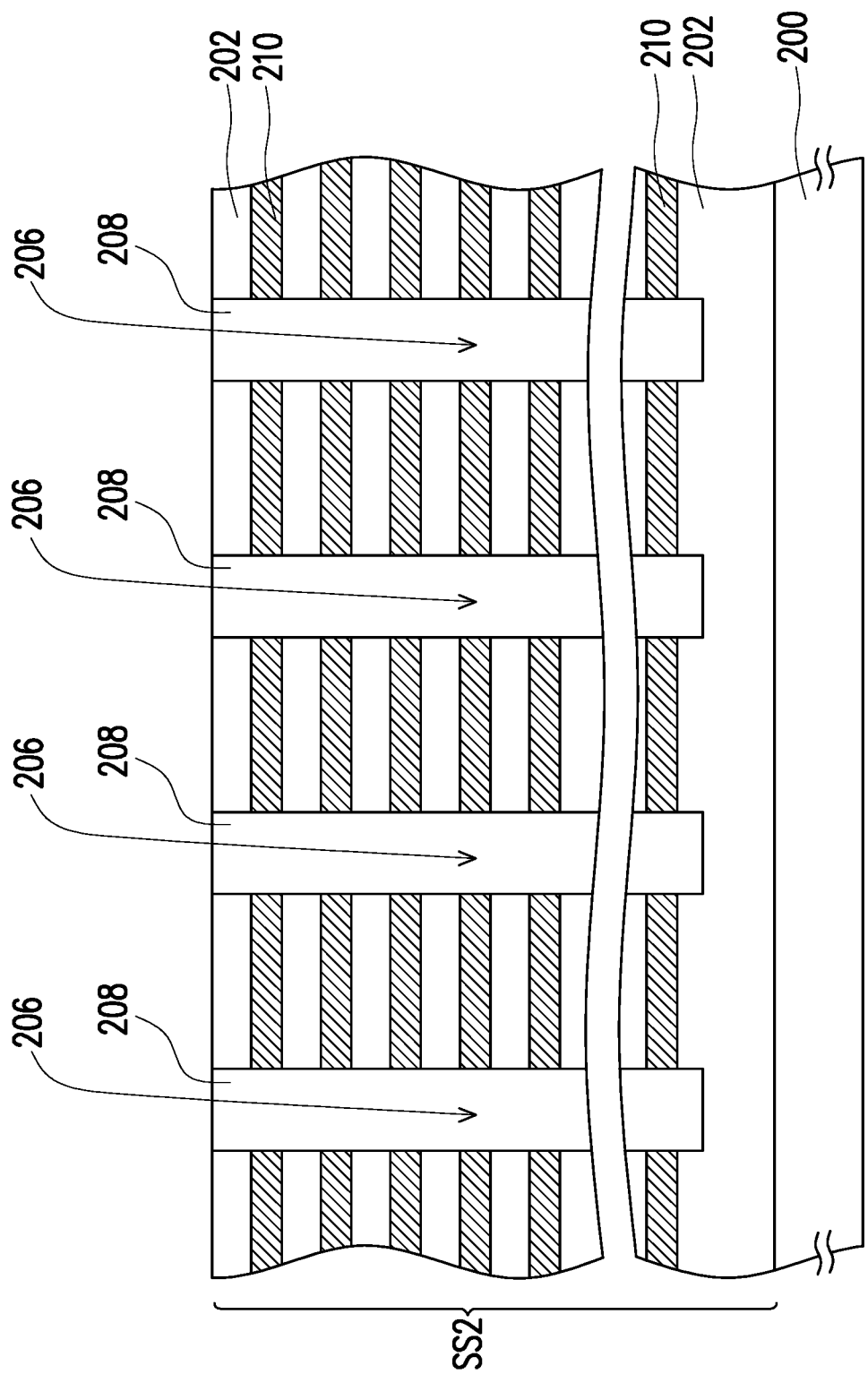

Referring to FIG. 4C, the sacrificial layers 204 are replaced with conductive layers 210. A material of the conductive layers 210 is doped polycrystalline silicon or metal, for example. Additionally, a method of forming the conductive layers 210 may be referred to the method of forming the conductive layers 112 in the above embodiment, and is not repeated here.

Thereby, a stacked structure SS2 may be formed on the substrate 200. The stacked structure SS2 includes the dielectric layers 202 and the conductive layers 210 alternately stacked. The stacked structure SS2 has the openings 206 passing through the conductive layers 210. In the embodiment, the stacked structure SS2 is formed by the above method, but the invention is not limited thereto.

Figure 4D:
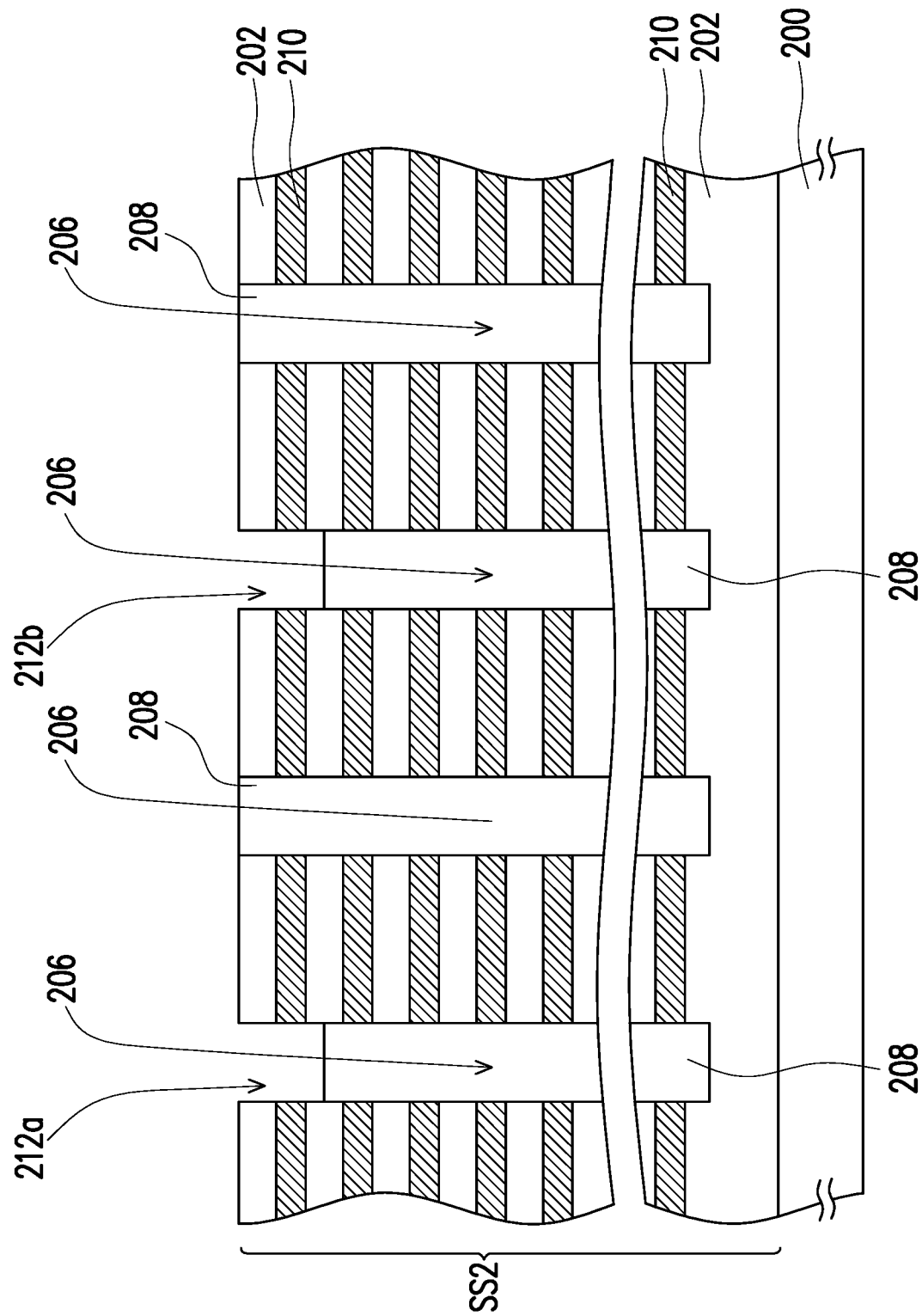
Figure 4E:
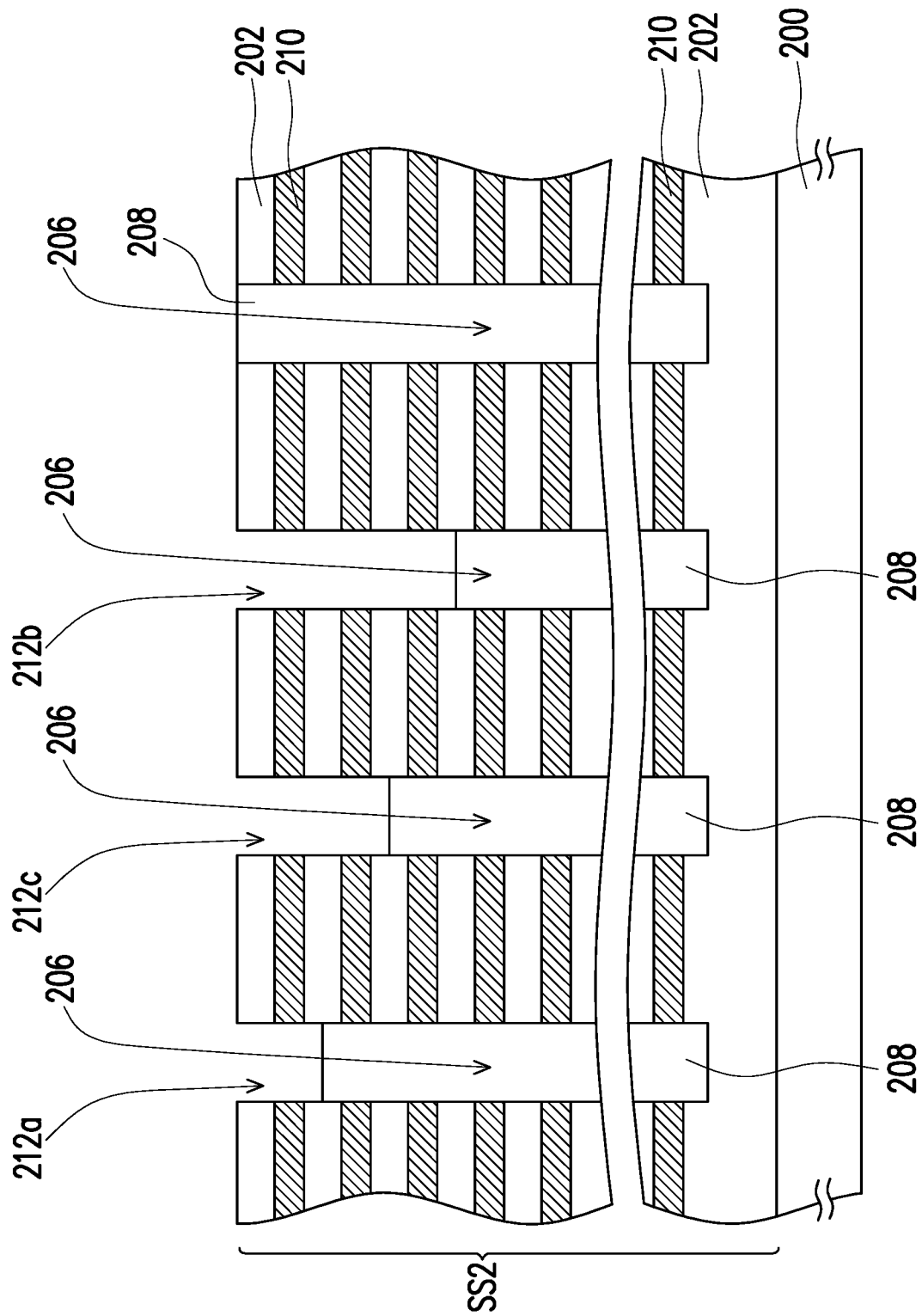
Figure 4F:
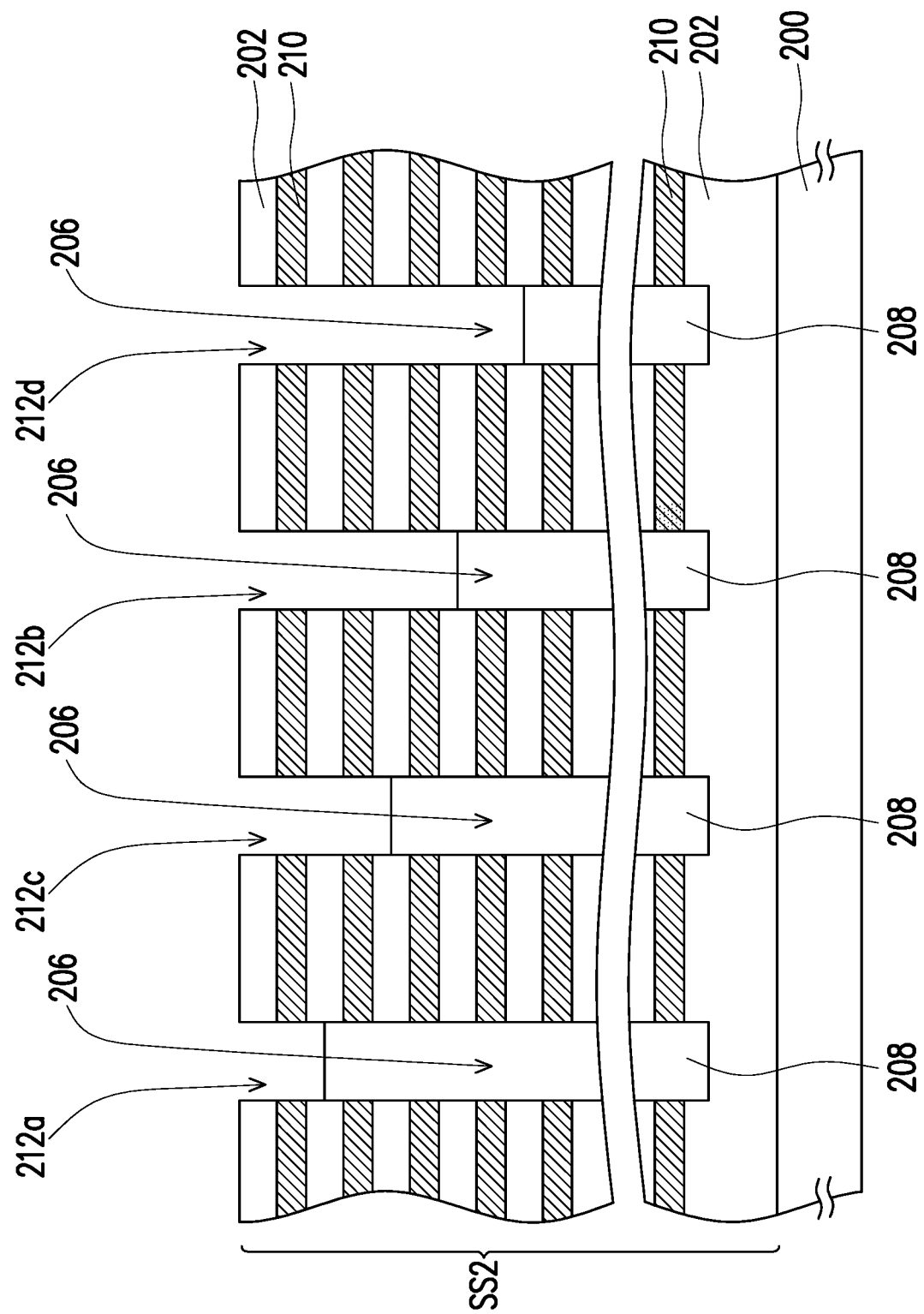

Referring to FIG. 4D to FIG. 4F, photolithography and etching processes are performed on the dielectric layers 208 to form contact openings (e.g., a contact opening 212a to a contact opening 212d) with different depths. The contact opening 212a to the contact opening 212d may be formed by at least one photolithography and etching process in the photolithography and etching processes. Additionally, the contact opening 212a to the contact opening 212d may be a portion of the openings 206. In the embodiment, a depth of the contact opening 212d may be more than a depth of the contact opening 212b, the depth of the contact opening 212b may be more than a depth of the contact opening 212c, and the depth of the contact opening 212c may be more than a depth of the contact opening 212a. Additionally, a method of forming the contact opening 212a to the contact opening 212d may be referred to the method of forming the contact opening 114a to the contact opening 114d in the above embodiment, and is not repeated here.

From FIG. 4D to FIG. 4F, photolithography and etching processes with different etching depths may be used in combination to form the contact openings (e.g., the contact opening 212a to the contact opening 212d) with various depths, so as to effectively reduce the number of photomasks required in the processes. Thereby, the manufacturing cost is reduced.

Figure 4G:
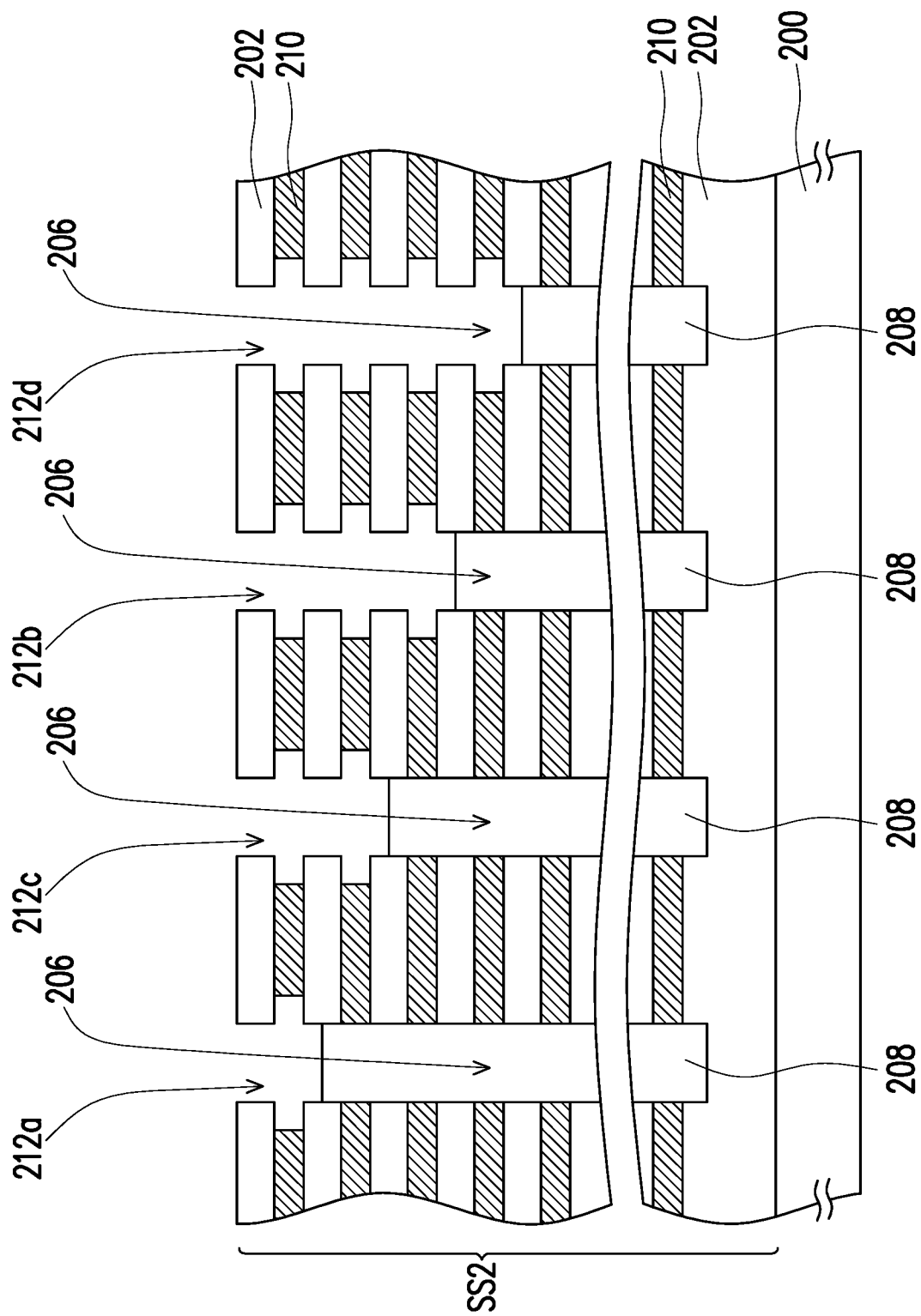

Referring to FIG. 4G, a portion of the conductive layers 210 exposed by the contact opening 212a to the contact opening 212d may be removed, such that the contact opening 212a to the contact opening 212d are extended between two adjacent dielectric layers 202. A method of removing the portion of the conductive layers 210 is wet etching, for example.

Figure 4H:
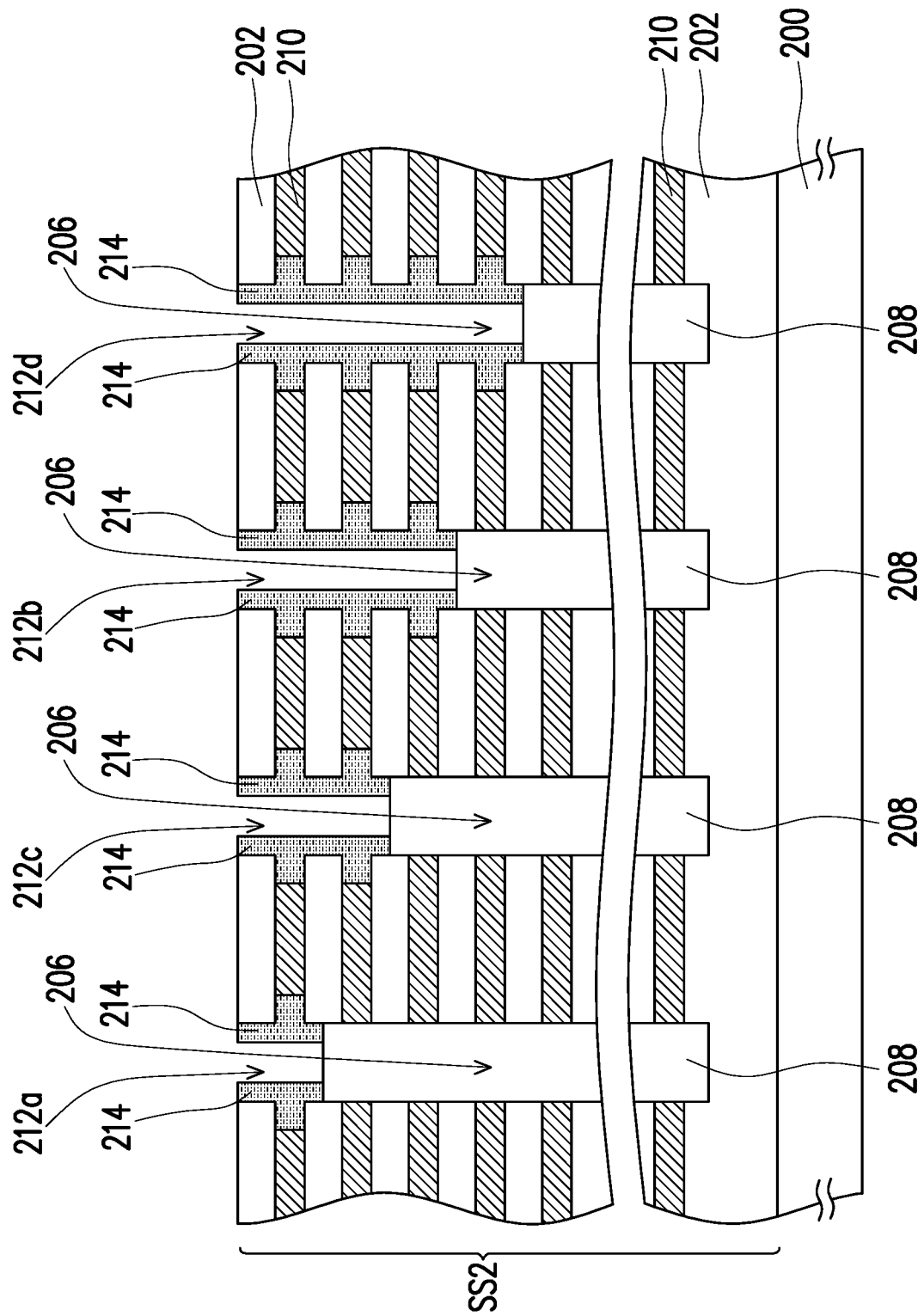

Referring to FIG. 4H, dielectric layers 214 are formed on sidewalls of the contact opening 212a to the contact opening 212d. Each of the dielectric layers 214 may be further extended between the two adjacent dielectric layers 202. The bottoms of the dielectric layers 214 may be located at different heights. A material of the dielectric layers 214 is silicon nitride, for example. A method of forming the dielectric layers 214 is to conformally form a dielectric material layer (not shown) on surfaces of the contact opening 212a to the contact opening 212d, and then to perform an etch-back process on the dielectric material layer, for example. A method of forming the dielectric material layer is chemical vapor deposition, for example.

Figure 4I:
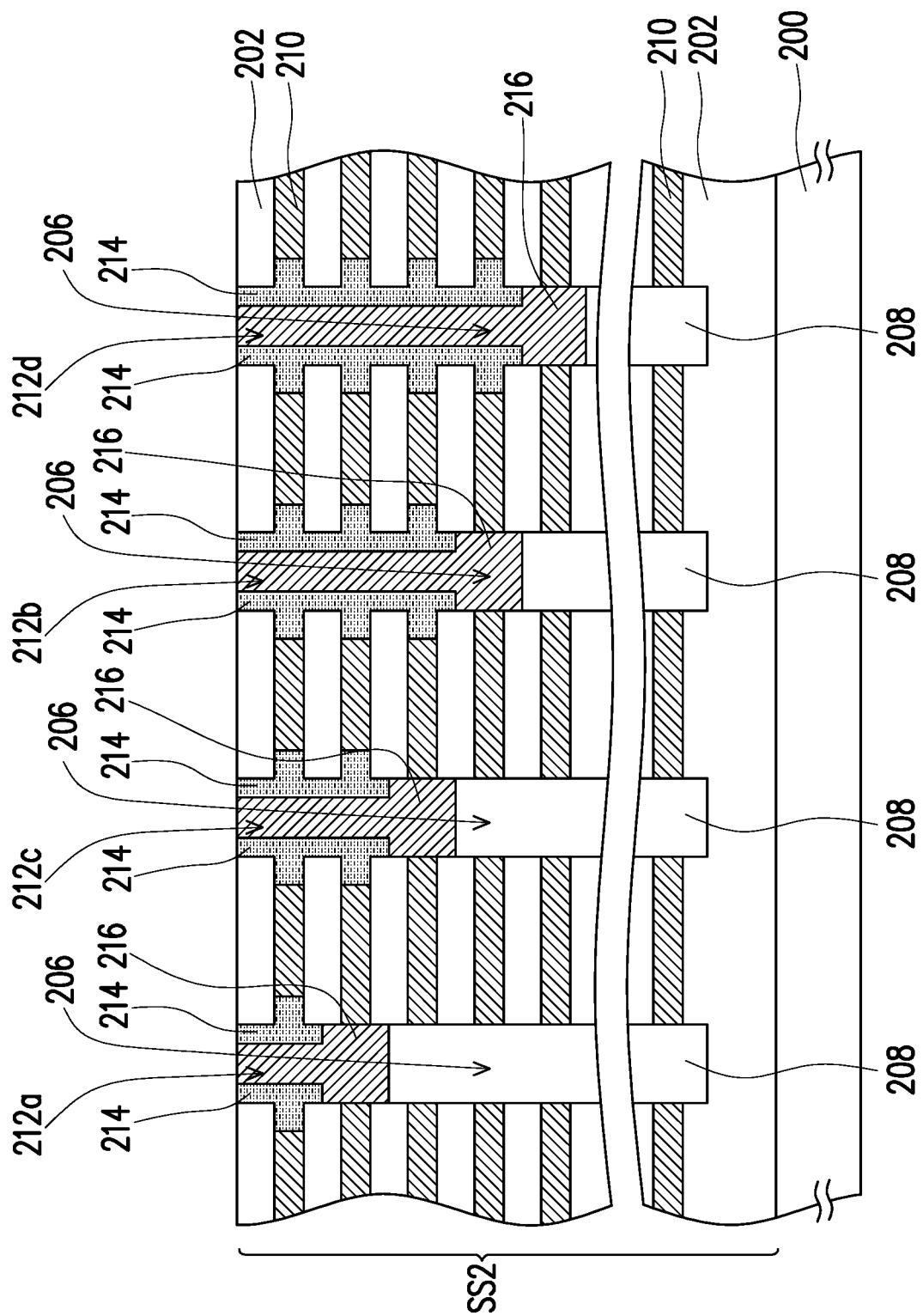

Referring to FIG. 4I, a portion of the dielectric layers 208 below the dielectric layers 214 is removed to expose a portion of the conductive layers 210. A method of removing the portion of the dielectric layers 208 includes wet etching.

Contacts 216 are formed in the contact opening 212a to the contact opening 212d. The bottoms of the contacts 216 are located at different heights. The contacts 216 and the conductive layers 210 are electrically connected in a one-to-one manner. The contacts 216 and the conductive layers 210 which are not electrically connected to each other may be isolated from each other by a dielectric material (e.g., the dielectric layers 208 and the dielectric layers 214). In the embodiment, the contacts 216 may not be electrically connected to an uppermost layer in the conductive layers 210, but the invention is not limited thereto. A material of the contacts 216 is tungsten, for example. A method of forming the contacts 216 is to form a contact material layer (not shown) filled in the contact opening 212a to the contact opening 212d, and then to perform a planarization process (e.g., a chemical mechanical polishing process or an etch-back process) on the contact material layer, for example. A method of forming the contact material layer is physical vapor deposition or chemical vapor deposition, for example. In the embodiment, the contacts 216 are formed by the above method, but the invention is not limited thereto.

Figure 4J:
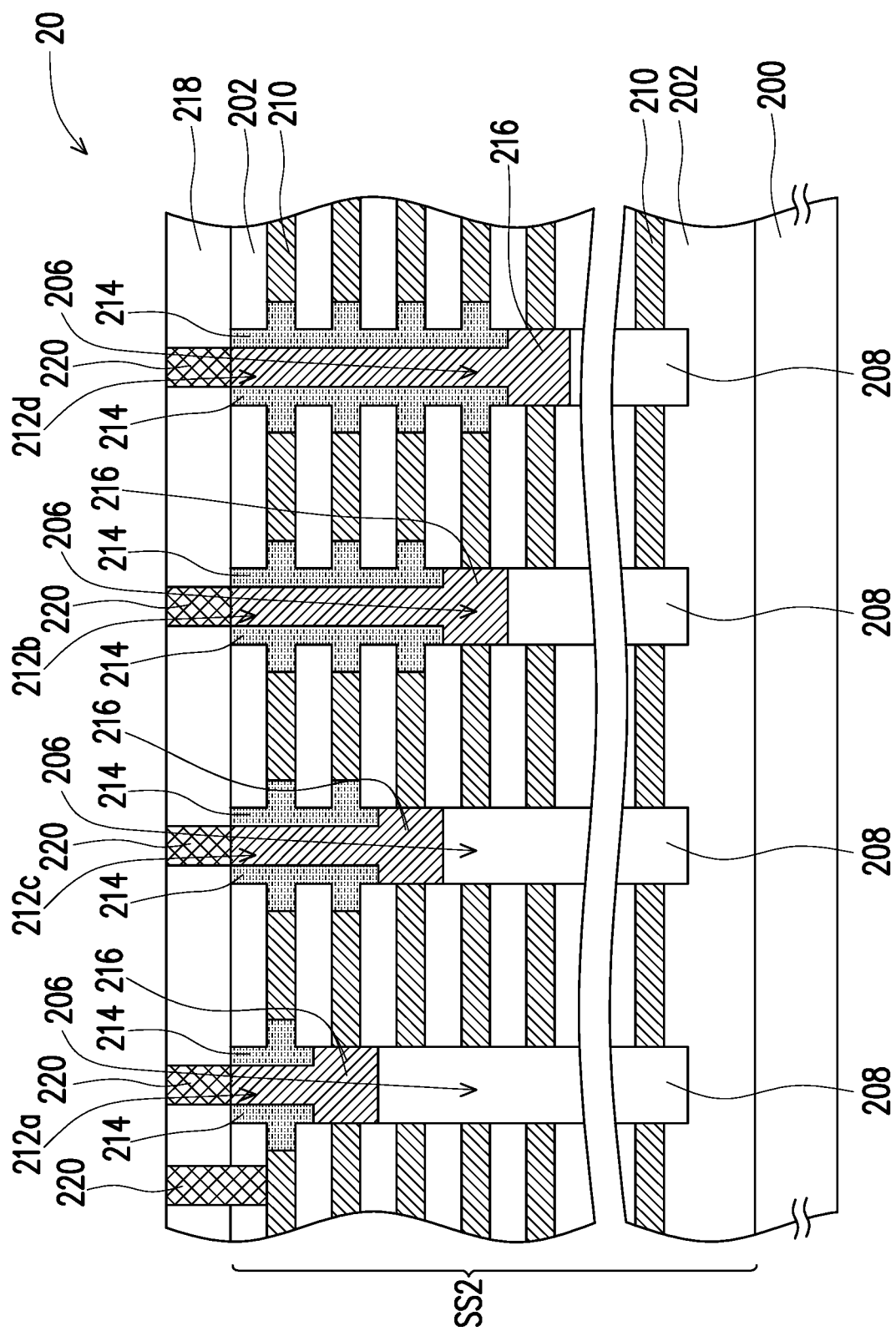

Referring to FIG. 4J, a dielectric layer 218 covering the stacked structure SS2 and the contacts 216 may be formed. A material of the dielectric layer 218 is silicon oxide, for example. A method of forming the dielectric layer 218 is chemical vapor deposition, for example.

Contacts 220 may be formed in the dielectric layer 218. The contacts 220 are electrically connected to the uppermost layer in the conductive layers 210 and the contacts 216 respectively. A material of the contacts 216 is tungsten, for example. A method of forming the contacts 220 is a damascene process, for example.

Based on the above embodiments, in the manufacturing method of an integrated circuit structure 20, the openings 206 pass through the conductive layers 210, the bottoms of the contacts 216 located in the openings 206 are located at different heights, and the contacts 216 and the conductive layers 210 are electrically connected in a one-to-one manner. Thereby, the contacts 216 may be respectively connected to the different conductive layers 210 in the stacked structure SS2 without forming the stepped pad structure requiring a large number of photomasks to make in the integrated circuit structure 20. Thus, the number of photomasks required in the processes can be effectively reduced, so as to reduce the manufacturing cost.

Hereinafter, the integrated circuit structure 20 of the above embodiment will be illustrated with FIG. 4J. The integrated circuit structure 20 may be applied to various semiconductor devices. For instance, the integrated circuit structure 20 may be applied to a 3D-NAND flash memory.

Referring to FIG. 4J, the integrated circuit structure 20 includes the substrate 200, the stacked structure SS2, and the contacts 216, and may further include at least one of the dielectric layers 208, the dielectric layers 214, the dielectric layer 218, and the contacts 220. The stacked structure SS2 is disposed on the substrate 200 and includes the dielectric layers 202 and the conductive layers 210 alternately stacked. The stacked structure SS2 has the openings 206 passing through the conductive layers 210. The contacts 216 are located in the openings 206. The bottoms of the contacts 216 are located at different heights. The contacts 216 and the conductive layers 210 are electrically connected in a one-to-one manner. In the embodiment, the contacts 216 may not be electrically connected to the uppermost layer in the conductive layers 210, but the invention is not limited thereto. The dielectric layers 208 are disposed in the openings 206. The contacts 216 are located on the dielectric layers 208. The dielectric layers 214 are disposed in the openings 206 and located between the conductive layers 210 and the contacts 216. The bottoms of the dielectric layers 214 may be located at different heights. Each of the dielectric layers 214 may be further extended between the two adjacent dielectric layers 202. The contacts 216 and the conductive layers 210 which are not electrically connected to each other may be isolated from each other by a dielectric material (e.g., the dielectric layers 208 and the dielectric layers 214). The dielectric layer 218 covers the stacked structure SS2 and the contacts 216. The contacts 220 are located in the dielectric layer 218 and electrically connected to the uppermost layer in the conductive layers 210 and the contacts 216 respectively.

Additionally, the materials, forming methods, and functions of each component in the integrated circuit structure 20 have been illustrated in detail in the aforementioned embodiments, and are not repeated here.

In summary, in the integrated circuit structure and the manufacturing method thereof provided by the above embodiments, the openings pass through the conductive layers, the bottoms of the contacts located in the openings are located at different heights, and the contacts and the conductive layers are electrically connected in a one-to-one manner. Thereby, the contacts may be respectively connected to the different conductive layers in the stacked structure without forming the stepped pad structure requiring a large number of photomasks to make in the integrated circuit structure. Thus, the number of photomasks required in the processes can be effectively reduced, so as to reduce the manufacturing cost.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. An integrated circuit structure, comprising:
   a substrate;
   a stacked structure, disposed on the substrate and comprising first dielectric layers and conductive layers alternately stacked, wherein the stacked structure has openings passing through the conductive layers;
   first contacts, located in the openings, wherein bottoms of the first contacts are located at different heights, the first contacts and the conductive layers are electrically connected in a one-to-one manner, the first contacts and the conductive layers which are not electrically connected to each other are isolated from each other, and the first contacts are not electrically connected to an uppermost layer in the conductive layers;
   second dielectric layers, disposed in the openings, wherein the first contacts are located on the second dielectric layers;
   third dielectric layers, disposed in the openings and located between the conductive layers and the first contacts, wherein bottoms of the third dielectric layers are located at different heights; and second contacts, electrically connected to the uppermost layer in the conductive layers and the first contacts respectively.

2. The integrated circuit structure according to claim 1, wherein a material of the conductive layers comprises doped polycrystalline silicon or metal.

3. The integrated circuit structure according to claim 1, wherein an arrangement of the first contacts comprises a two-dimensional arrangement or a one-dimensional arrangement.

4. The integrated circuit structure according to claim 1, further comprising:

isolation layers, wherein each of the isolation layers is disposed between two adjacent first dielectric layers, and a portion of the isolation layers is located between the conductive layers and the third dielectric layers.

5. The integrated circuit structure according to claim 1, wherein each of the third dielectric layers is further extended between two adjacent first dielectric layers.

6. The integrated circuit structure according to claim 1, further comprising:

a fourth dielectric layer covering the stacked structure and the first contacts, and the second contacts being located in the fourth dielectric layer.

* * * * *